(12) United States Patent
Takatsuka et al.

(10) Patent No.: US 12,183,837 B2
(45) Date of Patent: Dec. 31, 2024

(54) DETECTOR FOR DETECTING CHARGED PARTICLES OR LIGHT

(71) Applicant: HAMAMATSU PHOTONICS K.K., Hamamatsu (JP)

(72) Inventors: Sayaka Takatsuka, Hamamatsu (JP); Hiroshi Kobayashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 483 days.

(21) Appl. No.: 17/445,969

(22) Filed: Aug. 26, 2021

(65) Prior Publication Data

US 2022/0165890 A1 May 26, 2022

(30) Foreign Application Priority Data

Nov. 20, 2020 (JP) ................................. 2020-193255

(51) Int. Cl.
*H01L 31/02* (2006.01)
*H01J 49/02* (2006.01)
(Continued)

(52) U.S. Cl.
CPC .... *H01L 31/02027* (2013.01); *H01L 31/0224* (2013.01); *H01L 31/107* (2013.01); *H01J 49/025* (2013.01); *H01J 49/068* (2013.01)

(58) Field of Classification Search
CPC ............... H01L 31/0224; H01L 31/107; H01L 31/02027; H01J 49/025; H01J 49/068;
(Continued)

(56) References Cited

U.S. PATENT DOCUMENTS 5,614,708 A * 3/1997 Koishi ................... G11B 7/127
369/116
6,304,126 B1 * 10/2001 Berthiot .............. H01L 27/0255
361/111
(Continued)

FOREIGN PATENT DOCUMENTS

JP 2007-250585 A 9/2007
JP 2010-536165 A 11/2010
(Continued)

OTHER PUBLICATIONS

Hiroshi Kobayashi et al., "Development of novel ion detector that combines a microchannel plate with an avalanche diode", Nuclear Inst. and Methods in Physics Research, A, May 11, 2022, vol. 971, 164110, pp. 1-5.
(Continued)

*Primary Examiner* — Mouloucoulaye Inoussa
(74) *Attorney, Agent, or Firm* — Faegre Drinkder Biddle & Reath LLP

(57) ABSTRACT

An embodiment of the present disclosure relates to a detector that includes an AD and detects charged particles or light, and enables speeding up of response of the detector without changing a structure of the AD that limits the response of the detector. A drive circuit of the AD includes a first capacitor and a first resistor. Both the first capacitor and the first resistor are connected in series to the AD in a state where both terminals are set to have the same potential. This configuration reduces the apparent capacitance of the AD and speeds up the response of the entire detector including the drive circuit.

14 Claims, 19 Drawing Sheets

(51) Int. Cl.
*H01J 49/06* (2006.01)
*H01L 31/0224* (2006.01)
*H01L 31/107* (2006.01)

(58) Field of Classification Search
CPC .......... H01J 43/22; H01J 43/10; H01J 43/246; H01J 49/0031; H01J 49/067; H01J 49/0495; H01J 49/045; H01J 49/405; H01J 49/0486; H01J 49/24; H01J 49/0422
USPC ..... 313/103 R; 257/186, 464, 627, 438, 463, 257/E31.063, E31.061; 250/287, 282, 250/336.1, 289; 315/337, 537, 103 CM, 315/103 R
See application file for complete search history.

(56) References Cited

U.S. PATENT DOCUMENTS

| | | | |
|---|---|---|---|
| 11,621,154 B2* | 4/2023 | Wamsley | H01J 49/0031 250/288 |
| 2007/0181780 A1* | 8/2007 | Suzuki | H01L 27/14638 250/208.4 |
| 2008/0230686 A1* | 9/2008 | Suzuki | H01J 49/025 250/281 |
| 2008/0290267 A1* | 11/2008 | Hayashi | H01J 43/246 250/282 |
| 2009/0236517 A1* | 9/2009 | Suzuki | H01J 49/025 250/287 |
| 2010/0243887 A1* | 9/2010 | Suyama | H01J 49/40 250/289 |
| 2014/0097340 A1* | 4/2014 | Suzuki | H01J 43/246 250/336.1 |
| 2014/0152168 A1* | 6/2014 | Suzuki | H01J 43/246 313/103 R |
| 2015/0380457 A1* | 12/2015 | Fujii | G01T 1/241 378/19 |
| 2017/0047213 A1* | 2/2017 | Hayashi | H01J 43/246 |
| 2020/0373136 A1* | 11/2020 | Kobayashi | H01J 49/025 |

FOREIGN PATENT DOCUMENTS

| | | |
|---|---|---|
| JP | 2016-519435 A | 6/2016 |
| JP | 2017-016918 A | 1/2017 |
| JP | 2020-170594 A | 10/2020 |
| WO | WO-2009/018872 A1 | 2/2009 |
| WO | WO-2014/172697 A1 | 10/2014 |

OTHER PUBLICATIONS

A. Fukasawa et al., "High Speed HPD for Photon Counting", 2006 IEEE Nuclear Science Symposium Conference Record, 2006, pp. 43-47.

* cited by examiner

DETECTOR FOR DETECTING CHARGED PARTICLES OR LIGHT

TECHNICAL FIELD

The present disclosure relates to a detector that detects charged particles such as ions and electrons, or light.

This application claims priority from Japanese Patent Application No. 2020-193255 filed on Nov. 20, 2020, which is based on the contents of which are incorporated herein by reference in their entirety.

BACKGROUND

As a charged particle detector, for example, an ion detector used for time-of-flight mass spectrometry, a detector including a microchannel plate (hereinafter, referred to as "MCP") and an avalanche diode (hereinafter, referred to as "AD") is known (Patent Document 1). The MCP is an electron multiplication unit element that emits electrons in response to incidence of charged particles such as ions and electrons. The AD is an electronic device that captures emitted electrons and outputs the captured electrons as electric signals.

In such a detector, it is desired to increase the response characteristics of the AD. For example, the mass resolution in mass spectrometry depends on the response characteristics of the ion detector. Therefore, improvement of the mass resolution in mass spectrometry requires improvement of the response characteristics of the ion detector. Specifically, it is necessary to speed up the response of the ion detector.

The response speed of the ion detector including the MCP and the AD is limited by the response speed of the AD. That is, the response speed of the AD is a main factor that determines the response speed of the ion detector. Therefore, in order to improve the response characteristics of the ion detector, attempts have been made to speed up the response of the AD.

It is known to reduce the capacitance of the AD in order to speed up the response of the AD. The capacitance of the AD is proportional to the area of an active layer of the AD and inversely proportional to the thickness. Therefore, when the active layer of the AD is thickened, the capacitance of the AD can be reduced, and as a result, the response can be sped up (Patent Document 2).

Patent Document 1: Japanese Patent Application Laid-Open No. 2017-16918
Patent Document 2: Japanese Patent Application Laid-Open No. 2007-250585

SUMMARY

The inventors have found the following problems as a result of examining the above-described conventional technology. That is, when the active layer of the AD is thickened, the capacitance of the AD can be reduced. On the other hand, the thicker the active layer becomes, the longer the travel distance of carriers (electrons and holes) generated in the AD becomes, and the longer the travel time of the carriers becomes. As a result, the time waveform of the induced current is widened, which leads to a decrease in response speed. Therefore, there is a limit in speeding up of the response of the AD itself.

The present disclosure has been made to solve the above-described problems, and an object of the present disclosure is to achieve speeding up of response in a detector for detecting charged particles or light using the AD.

A detector according to the present disclosure is a detector for detecting charged particles or light, as an electronic device applicable to mass spectrometry, for example. The detector includes an AD that has an electron incidence plane on which electrons generated due to charged particles, photoelectrons generated due to light, or electrons generated by multiplying photoelectrons are incident, and a drive circuit that drives the AD. The drive circuit includes a first capacitor and a first resistor. The first capacitor and the first resistor are both connected in series to the AD, and the wiring in which the first capacitor is disposed and the wiring in which the first resistor is disposed are connected substantially in parallel.

DETAILED DESCRIPTION

Description of Embodiments of Present Disclosure

Figure 1:
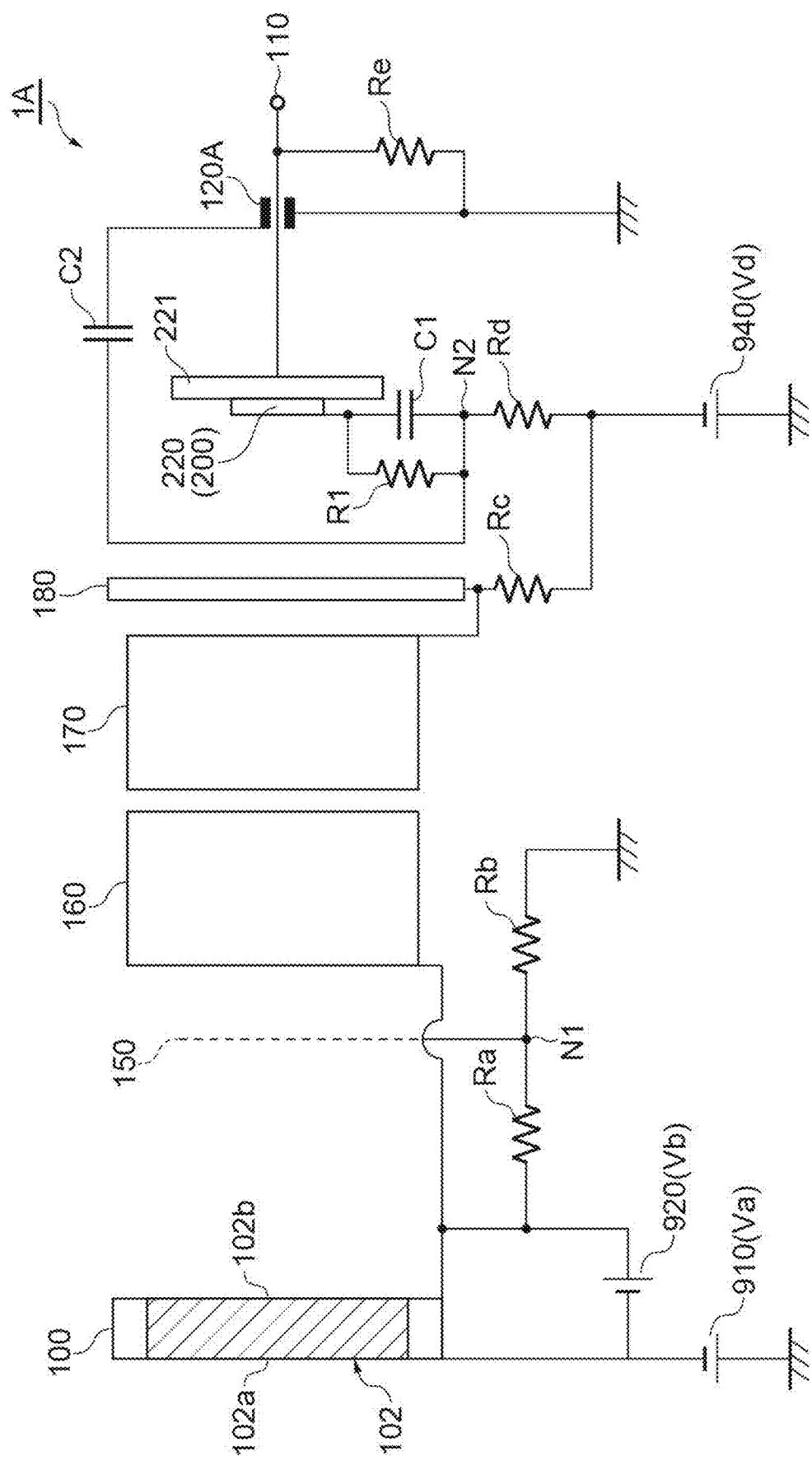
FIG. 1 is a view showing an example of a circuit configuration of an ion detector according to a first embodiment.

First, contents of the embodiments of the present disclosure will be individually listed and described.

(1) A detector of the present disclosure is a detector for detecting charged particles or light, and includes an avalanche diode (AD) and a drive circuit. The AD includes a first electrode, a second electrode, and an electron incidence plane. The first electrode is electrically connected to a power supply terminal set to a first reference potential different from the ground potential. The second electrode is electrically connected to a signal output terminal. Electrons generated due to charged particles, photoelectrons generated due to light, or electrons generated by multiplication of the photoelectrons are incident on the electron incidence plane. The drive circuit (avalanche diode drive circuit) drives the AD. The drive circuit includes a first capacitor and a first resistor, and the drive circuit further has a first circuit structure in which the first capacitor and the first resistor are disposed on the first electrode side of the AD, or a second circuit structure in which the first capacitor and the first resistor are disposed on the second electrode side of the AD.

In the drive circuit having the first circuit structure, the first capacitor is disposed on the wiring between the power supply terminal and the first electrode of the AD. The first capacitor has a first terminal electrically connected to the power supply terminal and a second terminal electrically connected to the first electrode of the AD. The first resistor has a first terminal electrically connected to the power supply terminal and a second terminal electrically connected to the first electrode of the AD. Then, meanwhile the first terminal of the first capacitor and the first terminal of the first resistor are set to have the same potential, the second terminal of the first capacitor and the second terminal of the first resistor are set to have the same potential.

On the other hand, in the drive circuit having the second circuit structure, the first capacitor is disposed on wiring located between the second electrode of the AD and a node set to have the second reference potential (e.g., the ground potential) different from the first reference potential, the wiring having a branch structure of the signal output terminal. The first capacitor has the first terminal electrically connected to the second electrode of the AD, and the second terminal electrically connected to the signal output terminal. The first resistor includes the first terminal electrically connected to the second electrode of the AD and the second terminal. The first terminal of the first resistor is set to have the same potential as that of the first terminal of the first capacitor. The second terminal of the first resistor is electrically connected to the second terminal of the first capacitor so as to be set to have the same potential as that of the second terminal of the first capacitor, or is set to have the same potential as that of the node (second reference potential).

Both of the first circuit structure and the second circuit structure described above enable speeding up of response of the entire detector including the AD and the drive circuit. Since the detector includes the first capacitor in which the drive circuit for driving the AD is connected in series to the AD, the AD having apparently small capacitance is connected. In addition, the first resistor is connected in parallel to the first capacitor or to the series wiring of the first capacitor and a voltage drop element. Therefore, even if the first capacitor is connected to the AD in series, voltage can be applied to the AD. As a result, it is possible to speed up response of the entire detector including the AD and the drive circuit.

(2) As one aspect of the present disclosure, the capacitance of the first capacitor is preferably 10 times or less the capacitance of the AD. In this case, it is possible to increase the effect of speeding up the response of the entire detector including the AD and the drive circuit.

(3) As one aspect of the present disclosure, the capacitance of the first capacitor may be equal to or less than the capacitance of the AD. In this case, it is possible to further increase the effect of speeding up the response of the entire detector including the AD and the drive circuit.

(4) As one aspect of the present disclosure, the resistance value of the first resistor is preferably 30 kΩ or more and 500 kΩ or less. In this case, it is possible to suppress fluctuation in the potential difference between the electrodes of the AD, and it is possible to maintain the symmetry of the response waveform.

(5) As one aspect of the present disclosure, the drive circuit may further include a second capacitor. In the first circuit structure, the signal output terminal is electrically connected to wiring between the second electrode of the AD and a node set to a second reference potential different from the first reference potential. On the other hand, the second capacitor includes a first terminal electrically connected to both the first terminal of the first capacitor and the first terminal of the first resistor, and a second terminal set to have the same potential (second reference potential) as that of the node. That is, the first terminal of the second capacitor is set to have the same potential as that of both the first terminal of the first capacitor and the first terminal of the first resistor. On the other hand, in the second circuit structure, the second capacitor has the first terminal (set to have the same potential as that of the first electrode of the AD) electrically connected to the first electrode of the AD, and the second terminal set to have the second reference potential as that of the node. In either case, a return path is formed between the electron incidence plane of the AD and the ground potential, and it is possible to cancel fluctuation of a DC component of the output voltage due to the voltage drop on the electron incidence plane that occurs with the continuous electron incidence to the AD. In addition, the high-speed signal output from the AD can return to the AD via the return path with low impedance.

(6) As one aspect of the present disclosure, the drive circuit having the first circuit structure (circuit structure in which both the first capacitor and the first resistor are disposed on the first electrode side of the AD) may further include a third capacitor as an AC coupler disposed on the wiring between the signal output terminal and the second electrode of the AD. The third capacitor includes a first terminal electrically connected to the second electrode of the AD, and a second terminal electrically connected to the signal output terminal. In this case, since the alternating-current component can be extracted as a signal, the detector can be applied to mass spectrometry, for example, in which bipolar ions can be detected.

(7) As one aspect of the present disclosure, the detector may further include a microchannel plate (MCP) and a focus electrode. The MCP has an input plane on which charged particles are incident and an output plane from which electrons generated due to the charged particles are emitted. The electrons emitted from the output plane of the MCP are focused by the focus electrode and then incident on the electron incidence plane of the AD. In this case, electrons generated due to incidence of the charged particles on the input plane of the MCP are multiplied by the MCP and then emitted from the output plane. Furthermore, such electrons are incident on the electron incidence plane of the AD after being focused by the focus electrode. Therefore, it is possible to detect charged particles with high sensitivity and high resolution.

(8) As one aspect of the present disclosure, the detector may further include a photoelectric conversion unit. The photoelectric conversion unit is an optical device that converts light into photoelectrons, and photoelectrons or electrons generated by multiplication of photoelectrons are incident on the electron incidence plane of the AD. In this case, photoelectrons generated due to incidence of light on the photoelectric conversion unit or electrons generated by multiplication of photoelectrons are incident on the electron incidence plane of the AD, so that it is possible to detect light with high sensitivity and high resolution.

Thus, each of the aspects listed in this [Description of Embodiments of Present Disclosure] section is applicable to each of all the remaining aspects or to all combinations of these remaining aspects.

DETAILS OF EMBODIMENTS OF PRESENT DISCLOSURE

A specific structure of a detector according to the present disclosure will be described in detail below with reference to the accompanying drawings. Note that the present invention is not limited to these examples, but is shown by the claims, and is intended to include all variations within the meaning and scope equivalent of the claims. In the description of the drawings, identical elements are given identical reference numerals and redundant description is omitted.

First Embodiment

FIG. 1 is a view showing an example of the circuit configuration of an ion detector 1A according to the first embodiment of the detector of the present disclosure. The ion detector 1A according to the first embodiment includes an MCP unit 100 as an electron multiplication unit, a mesh-like acceleration electrode 150, a pair of focus electrodes (electron lenses) 160 and 170, an AD cover 180, an AD 220 as a signal output unit 200, and a signal output terminal 110.

The MCP unit 100 includes an MCP 102 having an input plane 102a and an output plane 102b, and a side surface of the MCP 102 is surrounded by an insulating ring made of an insulating material. When charged particles are incident on the input plane 102a, the MCP 102 generates electrons in response to the charged particles, multiplies the electrons, and then emits the multiplied electrons from the output plane 102b. The MCP 102 includes a main body that is a thin disk-shaped structure mainly composed of lead glass as an example, and the main body is formed with a channel that is a plurality of through holes extending along a thickness direction (direction from the input plane 102a toward the output plane 102b) except for an annular outer peripheral portion. Furthermore, electrodes are formed on an outer peripheral portion of the input plane 102a and an outer peripheral portion of the output plane 102b.

The acceleration electrode 150 is disposed between the MCP 102 and the AD 220, for example, between the MCP 102 and the focus electrode 160, and accelerates electrons emitted from the output plane 102b of the MCP 102.

The pair of focus electrodes 160 and 170 are disposed between the MCP 102 and the AD 220, for example, between the acceleration electrode 150 and the AD 220, and focuses the electrons accelerated by the acceleration electrode 150 toward the AD 220.

The AD cover 180 prevents electrons converged toward the AD 220 from hitting a printed wiring board 221 mounted with the AD 220 and charging up the printed wiring board 221.

The AD 220 is mounted on the upper surface (the surface on the output plane 102b side) of the printed wiring board 221, and faces the output plane 102b of the MCP 102 across the acceleration electrode 150 and the pair of focus electrodes 160 and 170. An SMA jack 120A is attached to the lower surface (the surface on the signal output terminal 110 side) of the printed wiring board 221. The AD 220 captures the electrons focused by the pair of focus electrodes 160 and 170 and outputs the electrons as an electric signal.

The input plane 102a of the MCP unit 100 is connected to a power supply 910 and set to have a potential Va (e.g., −7 kV). A potential difference Vb (e.g., 500 V to 1 kV) is secured by the power supply 920 between the input plane 102a and the output plane 102b. The output plane 102b is grounded via a resistor Ra (e.g., 40 MΩ) and a resistor Rb (e.g., 20 MΩ) connected in series with each other between the output plane 102b and ground wiring. The potential (i.e., the potential difference between the output plane 102b and the ground potential) of the output plane 102b is divided by the resistors Ra and Rb. The acceleration electrode 150 is connected to a node N1, which is located between the resistors Ra and Rb. Of the pair of focus electrodes, the focus electrode 160 located on the output plane 102b side is set to have the same potential as that of the output plane 102b of the MCP 102.

Of the pair of focus electrodes, the focus electrode 170 located on the AD 220 side is connected to a power supply 940 set to have a potential Vd (e.g., 0 to 400V) via a resistor Rc (e.g., 1 kΩ). The AD cover 180 is set to have the same potential as that of the focus electrode 170.

The power supply 940 is connected to a P-side electrode (first electrode) of the AD 220 via a resistor Rd (e.g., 1 kΩ), a capacitor C1, which is a first capacitor, and a resistor R1, which is a first resistor. The capacitor C1 and the resistor R1 are both connected in series to the P-side electrode of the AD 220 and the resistor Rd, and connected in parallel to each other. Note that the P-side electrode of the AD 220 is an electrode in ohmic contact with a P$^+$ type semiconductor layer of the AD 220, and the AD 220 has an electron incidence plane on the P-side. Details will be described later.

A node N2, which is located between the capacitor C1 and the resistor R1 and the resistor Rd, are connected to the side surface of the SMA jack 120A via a capacitor C2 (e.g., 10 nF), which is the second capacitor, and the side surface of the SMA jack 120A is grounded. The signal output terminal 110 is also grounded via a termination resistor Re (e.g., 50Ω). Therefore, a return path is formed between the electron incidence plane of the AD 220 and the grounded side surface of the SMA jack 120A. When electron incidence onto the AD 220 continues, a voltage drop occurs on the electron incidence plane of the AD 220. In this case, the signal (output voltage) output from the AD 220 to the signal output terminal 110 reflects the fluctuation of the DC component due to this voltage drop. Therefore, by disposing the capacitor C2 between the electron incidence plane of the AD 220 and the side surface of the SMA jack 120A, the fluctuation of the DC component reflected in the output signal is canceled. In addition, the capacitor C2 enables the high-speed signal output from the AD 220 to the signal output terminal 110 to return to the AD 220 via the return path with low impedance.

Figure 2:
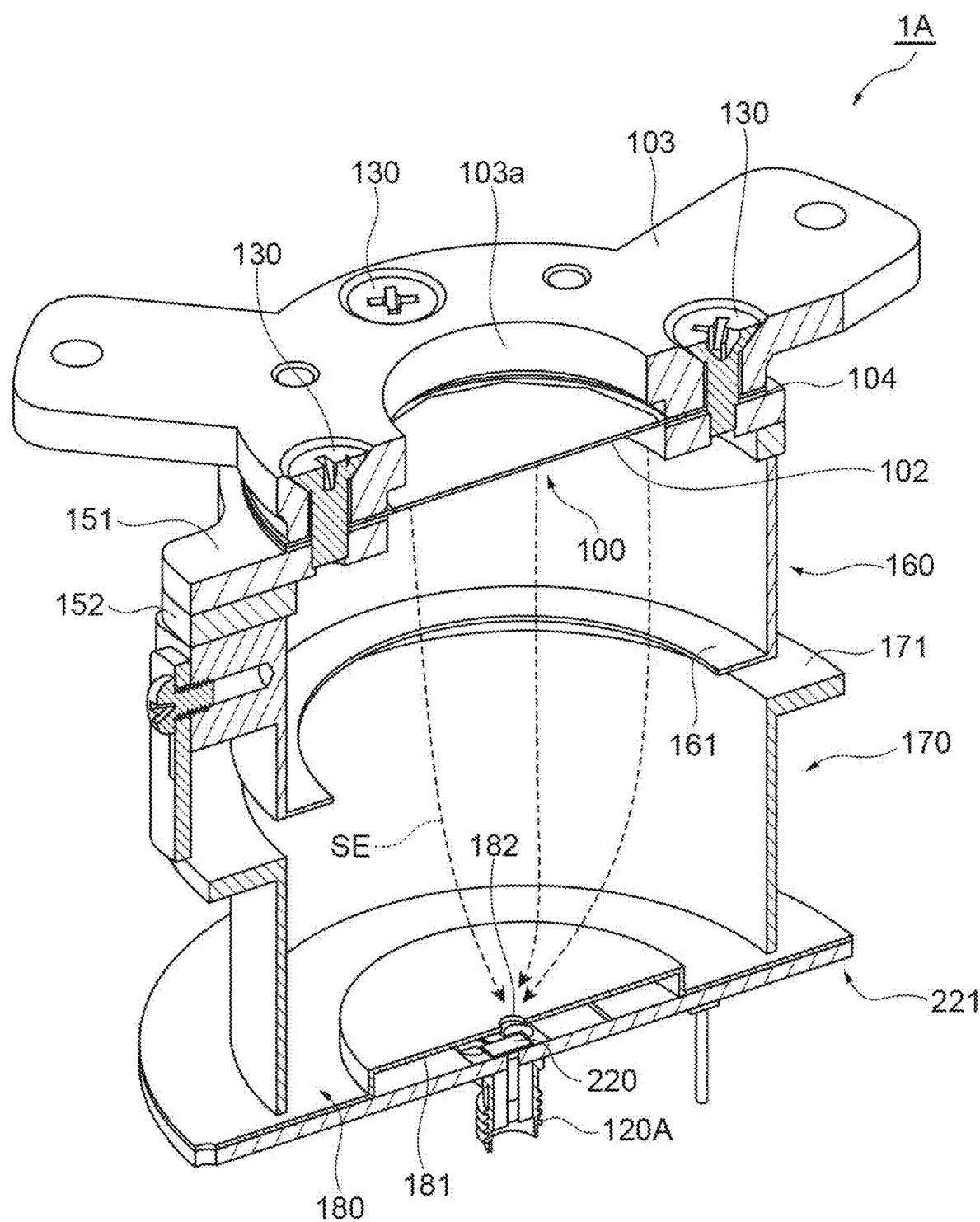
FIG. 2 is a cutaway perspective view showing an example of a structure of the ion detector according to the first embodiment.

FIG. 2 is a cutaway perspective view showing an example of the structure of the ion detector 1A according to the first embodiment. The ion detector 1A includes the MCP unit 100, the mesh-like acceleration electrode 150 not illustrated, the pair of focus electrodes 160 and 170, and the printed wiring board 221 mounted with the AD 220, and these are fixed to one another.

The MCP unit 100 includes the MCP 102, an input-side electrode 103, and an output-side electrode 104. The side surface of the MCP 102 is surrounded by the insulating ring as described above. The annular outer peripheral portion of the MCP 102 and the insulating ring are sandwiched between the input-side electrode 103 and the output-side electrode 104. The input-side electrode 103 has an opening 103a for allowing charged particles incident on the input plane 102a of the MCP 102 to pass therethrough. Similarly, the output-side electrode 104 has an opening for allowing electrons emitted from the output plane 102b of the MCP 102 to pass therethrough. The central axis of the opening 103a of the input-side electrode 103 and the central axis of the opening of the output-side electrode 104 coincide with the central axis of the MCP 102.

The acceleration electrode 150 not illustrated is sandwiched between a first insulating spacer 151 and a second insulating spacer 152.

The input-side electrode 103, the insulating ring surrounding the side surface of the MCP 102, the output-side electrode 104, and the first insulating spacer 151 are fixed to one another by fixing screws 130. Thus, the MCP unit 100 and the acceleration electrode 150 are fixed to each other.

The focus electrode 160 is a cylindrical conductive member, and its central axis coincides with the central axis of the MCP 102. One end of the focus electrode 160 is fixed to the second insulating spacer 152. An annular portion 161 protruding toward the inside of the cylinder is provided at the other end of the focus electrode 160. The other end of the focus electrode 160 faces one end of the focus electrode 170.

The focus electrode 170 is a cylindrical conductive member, and its central axis coincides with the central axis of the MCP 102. A flange portion 171 is provided at one end of the focus electrode 170.

The AD cover 180 is a disk-shaped conductive member, and is provided so as to close the other end of the focus electrode 170. A circular protrusion 181 protruding in the direction of the MCP unit 100 is formed on the AD cover 180. The protrusion 181 has an opening 182 for passing an electron SE emitted from the output plane 102b of the MCP 102 and focused by the pair of focus electrodes 160 and 170. The central axis of the protrusion 181 coincides with the central axis of the MCP 102. The central axis of the opening 182 is shifted from the central axis of the MCP 102 along the bias direction of the MCP 102.

The printed wiring board 221 mounted with the AD 220 is attached to the AD cover 180 and covered by the AD cover 180.

Figure 3:
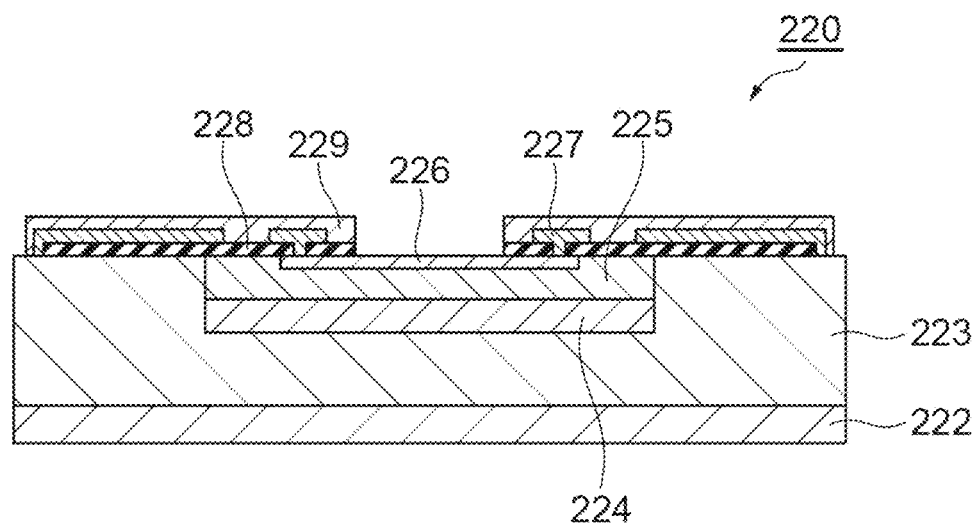
FIG. 3 is a cross-sectional view schematically showing an example of a structure of an AD of the ion detector according to the first embodiment.

FIG. 3 is a cross-sectional view schematically showing an example of the structure of the AD 220 of the ion detector 1A according to the first embodiment. The AD 220 includes an N-side electrode 222 (second electrode), an $N^+$ type semiconductor layer 223, an $N^-$ type semiconductor layer 224, a P type semiconductor layer (avalanche multiplication layer) 225, a $P^+$ type semiconductor layer 226, a P-side electrode 227 (first electrode), an insulating film 228, and a passivation film 229. The N-side electrode 222 is provided on the rear surface of the $N^+$ type semiconductor layer 223. The $N^-$ type semiconductor layer 224 and the P type semiconductor layer 225 are formed on the front surface side of the $N^+$ type semiconductor layer 223 by ion implantation, for example. In the thickness direction of the $N^+$ type semiconductor layer 223, the $N^-$ type semiconductor layer 224 is located between the $N^+$ type semiconductor layer 223 and the P type semiconductor layer 225. The $N^-$ type semiconductor layer 224 and the P type semiconductor layer (avalanche multiplication layer) 225 constitute an active layer. The $P^+$ type semiconductor layer 226 is provided on the front surface of the P type semiconductor layer 225 and functions as a P type contact layer. The insulating film 228 covers the surface of a semiconductor structure including the $N^+$ type semiconductor layer 223, the $N^-$ type semiconductor layer 224, the P type semiconductor layer 225, and the $P^+$ type semiconductor layer 226. The insulating film 228 has an opening for allowing electrons to pass therethrough. The P-side electrode 227 is disposed on the insulating film 228 so as to surround the opening of the insulating film 228. The P-side electrode 227 forms an ohmic contact with the $P^+$ type semiconductor layer 226 through another opening formed in the insulating film 228. The passivation film 229 is an insulation film and covers the P-side electrode 227 and the insulating film 228. The AD 220 is mounted on the upper surface of the printed wiring board 221 such that the P-side ($P^+$ type semiconductor layer 226 side) faces the output plane 102b of the MCP 102. That is, the AD 220 has an electron incidence plane on the P-side.

Figure 4:
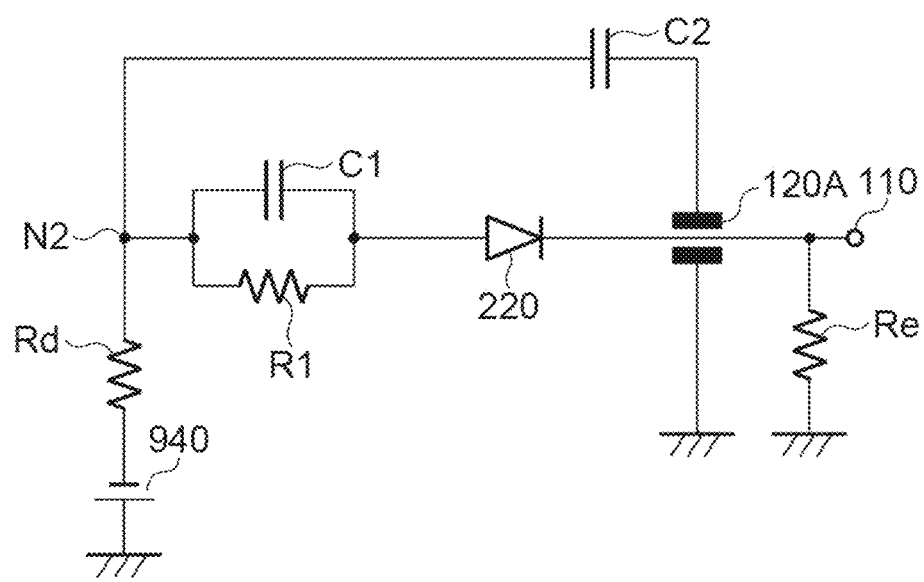
FIG. 4 is a circuit diagram showing an example of an AD drive circuit of the ion detector according to the first embodiment.

FIG. 4 is a circuit diagram showing an example of an AD drive circuit of the ion detector 1A according to the first embodiment. Note that the circuit symbol of the AD 220 shown in FIG. 4 is indicated by a general diode circuit symbol in order to be distinguished from a Zener diode 250 described later. Also in the circuit described later, the AD 220 is indicated by a general diode circuit symbol. In addition, the drive circuit of FIG. 4 has a first circuit structure (circuit structure in which the first capacitor and the first resistor are arranged on the P-side electrode side of the AD 220). As described above, the P-side electrode (first electrode) of the AD 220 is connected to the power supply terminal (first reference potential different from ground potential) of the power supply 940 via the resistor Rd, the capacitor C1, which is the first capacitor, and the resistor R1, which is the first resistor. The other power supply terminal of the power supply 940 is grounded. The capacitor C1 and the resistor R1 are both connected in series to the AD 220 and the resistor Rd, and connected in parallel to each other. The node N2, which is located between the capacitor C1 and the resistor R1 and the resistor Rd, are grounded via the capacitor C2, which is the second capacitor, and the side surface of the SMA jack 120A to form a return path. The N-side electrode (second electrode) of the AD 220 is connected to the signal output terminal 110 branched from the wiring between the N-side electrode and a node $N_F$ set to have the ground potential (second reference potential).

Figure 5:
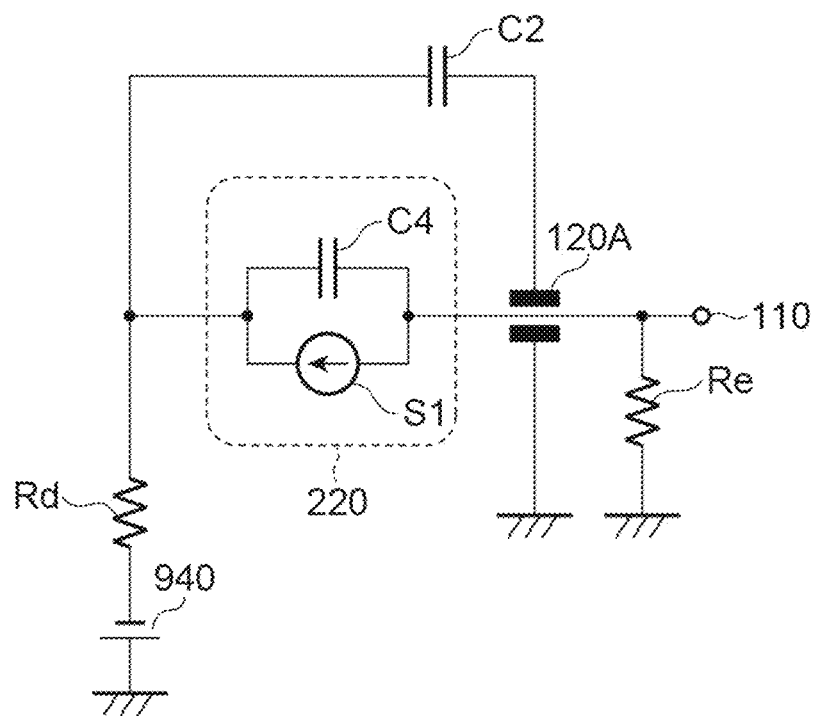
FIG. 5 is a circuit diagram showing an equivalent circuit of an AD drive circuit of a comparative example.
Figure 6:
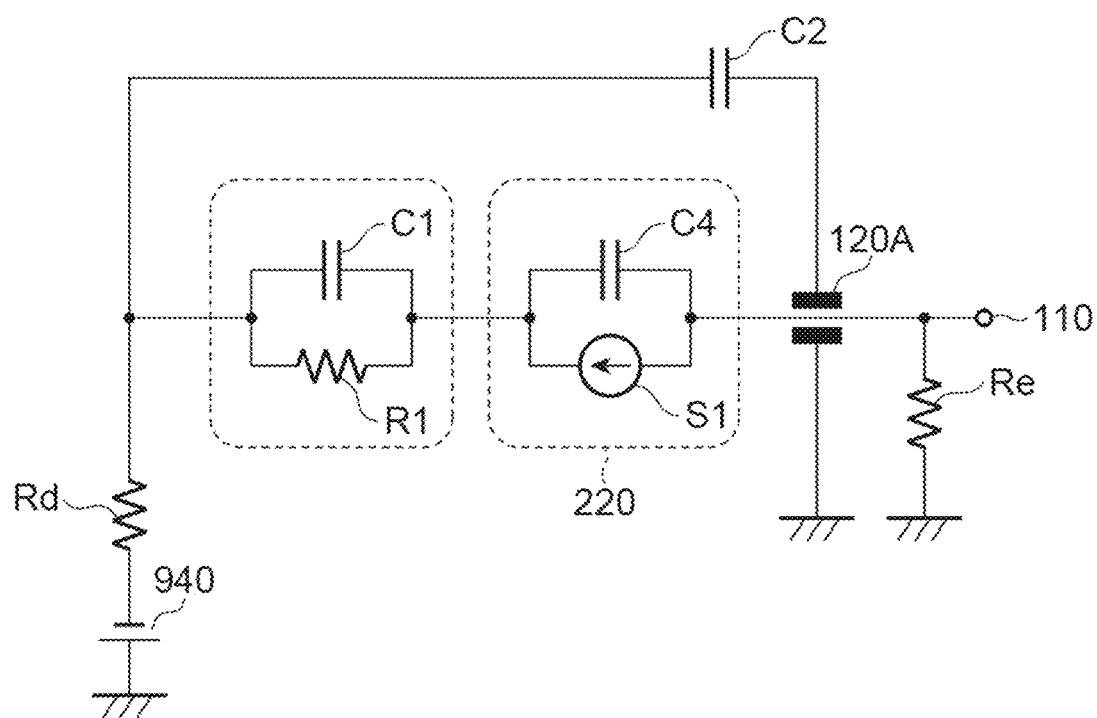
FIG. 6 is a circuit diagram showing an equivalent circuit of an example of the AD drive circuit of the ion detector according to the first embodiment.

The operation of the AD drive circuit of the ion detector 1A according to the first embodiment will be described with reference to FIGS. 5 to 7. FIG. 5 is a circuit diagram showing an equivalent circuit of an AD drive circuit of a comparative example. FIG. 6 is a circuit diagram showing an equivalent circuit of an example of the AD drive circuit of the ion detector 1A according to the first embodiment.

Figure 7:
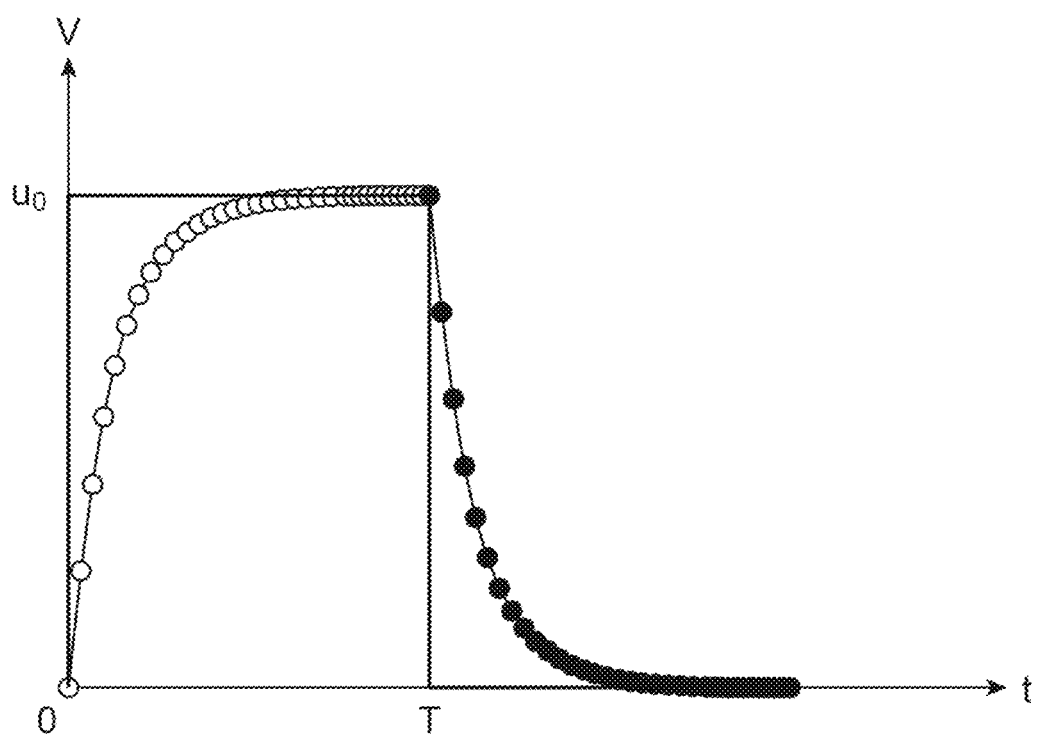
FIG. 7 is a waveform diagram showing an example of a response waveform of the AD.

FIG. 7 is a waveform diagram showing an example of a response waveform of the AD 220. In FIGS. 5 and 6, the AD 220 is represented by an equivalent circuit, i.e., a circuit in which a capacitor C4 having a capacitance $C_{AD}$ and a current source Si are connected in parallel to each other.

In the AD drive circuit of the comparative example (FIG. 5), the P-side electrode of the AD 220 is connected to the power supply 940 that applies an AD bias only via the resistor Rd, and the N-side electrode of the AD 220 is connected to the signal output terminal 110. In this AD drive circuit, assuming that the induced current of the AD 220 has a constant value $u_0$ at $0 \leq t \leq T$ (t: time, T: duration of induced current), a response waveform v of the AD 220 is expressed by the following expressions (1) and (2). Here, R represents the impedance of the load, C includes the AD 220 and represents the effective capacitance of the circuit through which the induced current flows.

$$v = Ru_0\left(1 - e^{-\frac{1}{RC}t}\right)(0 \leq t \leq T) \quad (1)$$

$$v = Ru_0 e^{-\frac{1}{RC}(t-T)}(t \geq T) \quad (2)$$

The response waveform of the AD 220 represented by the above expressions (1) and (2) is shown in FIG. 7. A white circle shown in FIG. 7 corresponds to expression (1), and a black circle corresponds to expression (2). As seen by referring to the above expressions (1) and (2) and the response waveform shown in FIG. 7, in order to narrow the half-value width of the response waveform to speed up the response, it is necessary to reduce the capacitance C or shorten the duration T of the induced current.

In the AD drive circuit (FIG. 6) of the ion detector 1A according to the first embodiment, the capacitor C1 having a capacitance $C_1$ and the resistor R1 are added. The capacitor C1 and the resistor R1 are both connected in series to the AD 220, and connected in parallel to each other. Therefore, a combined capacitance $C_T$ obtained by combining the capacitance $C_{AD}$ of the AD 220 (the capacitance of the capacitor C4 included in the equivalent circuit of the AD 220) and the capacitance $C_1$ of the capacitor C1 becomes smaller than the capacitance $C_{AD}$ of the AD 220 as expressed by the following expression (3).

$$C_T = \frac{C_{AD}C_1}{C_{AD} + C_1} < C_{AD} \quad (3)$$

This means that in the AD drive circuit shown in FIG. 6, the AD 220 having an apparently small capacitance is connected as compared with the AD drive circuit of the comparative example shown in FIG. 5. On the other hand, if the AD 220 to be used is the same in both AD drive circuits, the thickness of the active layer of the AD 220, the travel distance and travel time of the carrier generated in the AD 220, and the induced current of the AD 220 are the same in both drive circuits. Therefore, even if the AD drive circuit shown in FIG. 6 is used instead of the AD drive circuit shown in FIG. 5, the induced current does not spread, and this does not cause a decrease in response speed. In addition, since the resistor R1 is connected in parallel to the capacitor C1, voltage can be applied to the AD 220 even if the capacitor C1 is connected in series to the AD 220.

Therefore, according to the ion detector 1A according to the first embodiment, it is possible to speed up the response of the entire ion detector including the AD 220 and the AD drive circuit.

As the capacitance $C_1$ of the capacitor C1 becomes larger than the capacitance $C_{AD}$ of the AD 220, the combined capacitance $C_T$ approaches the capacitance $C_{AD}$ of the AD 220. Hence, the effect of reducing the apparent capacitance of the AD 220 is reduced. When the resistance value of the resistor R1 becomes about the same as or more than the resistance value of the AD 220, a large voltage drop occurs in the resistor R1. Since the voltage applied from the power supply 940 to the AD 220 decreases by the voltage drop amount, there is a possibility that the voltage necessary for driving the AD 220 cannot be applied.

Figure 8:
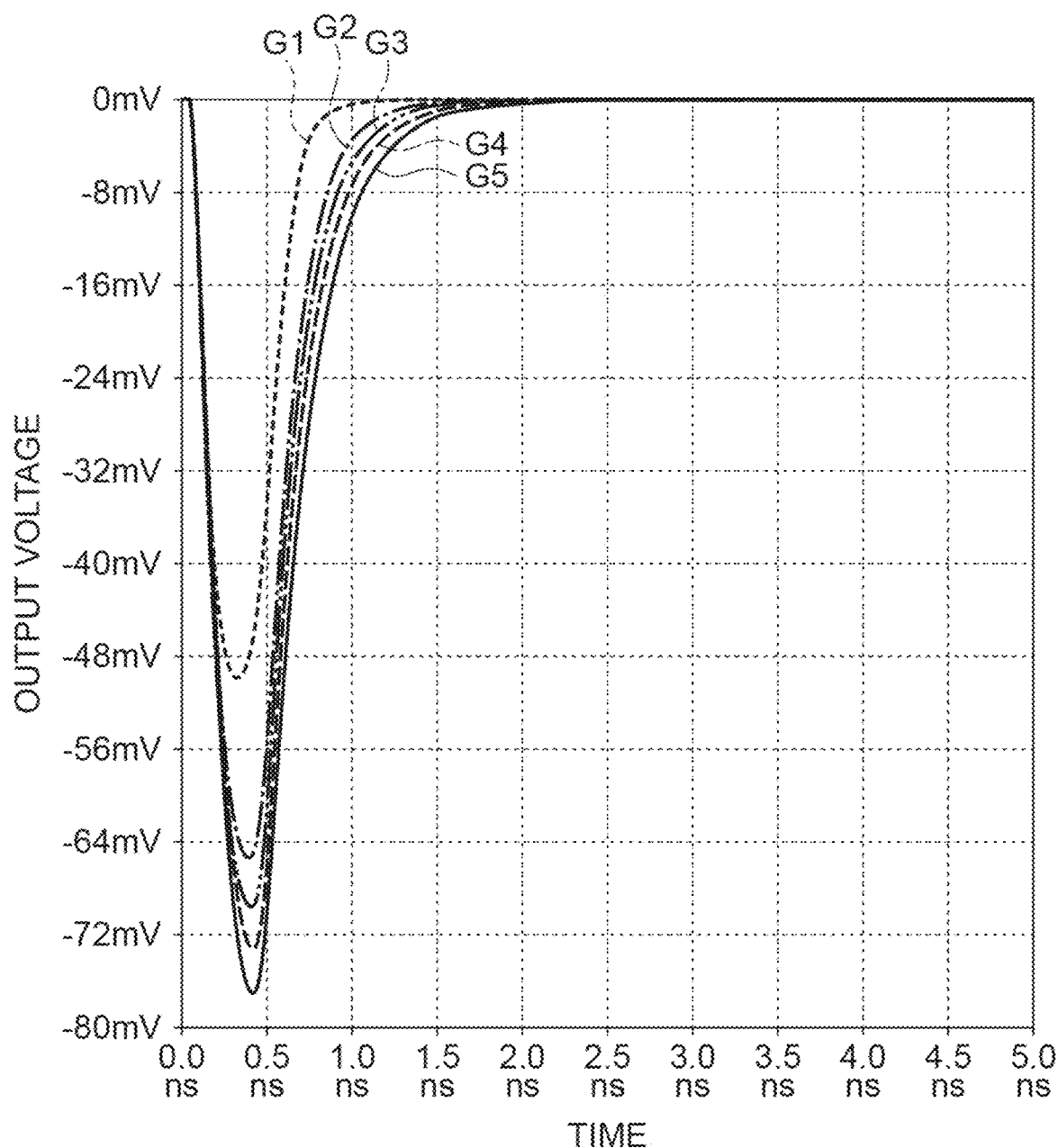
FIG. 8 is a view showing an example of a result of simulating a response waveform of the AD having an effective diameter of the electron incidence plane of 1 mm.
Figure 9:
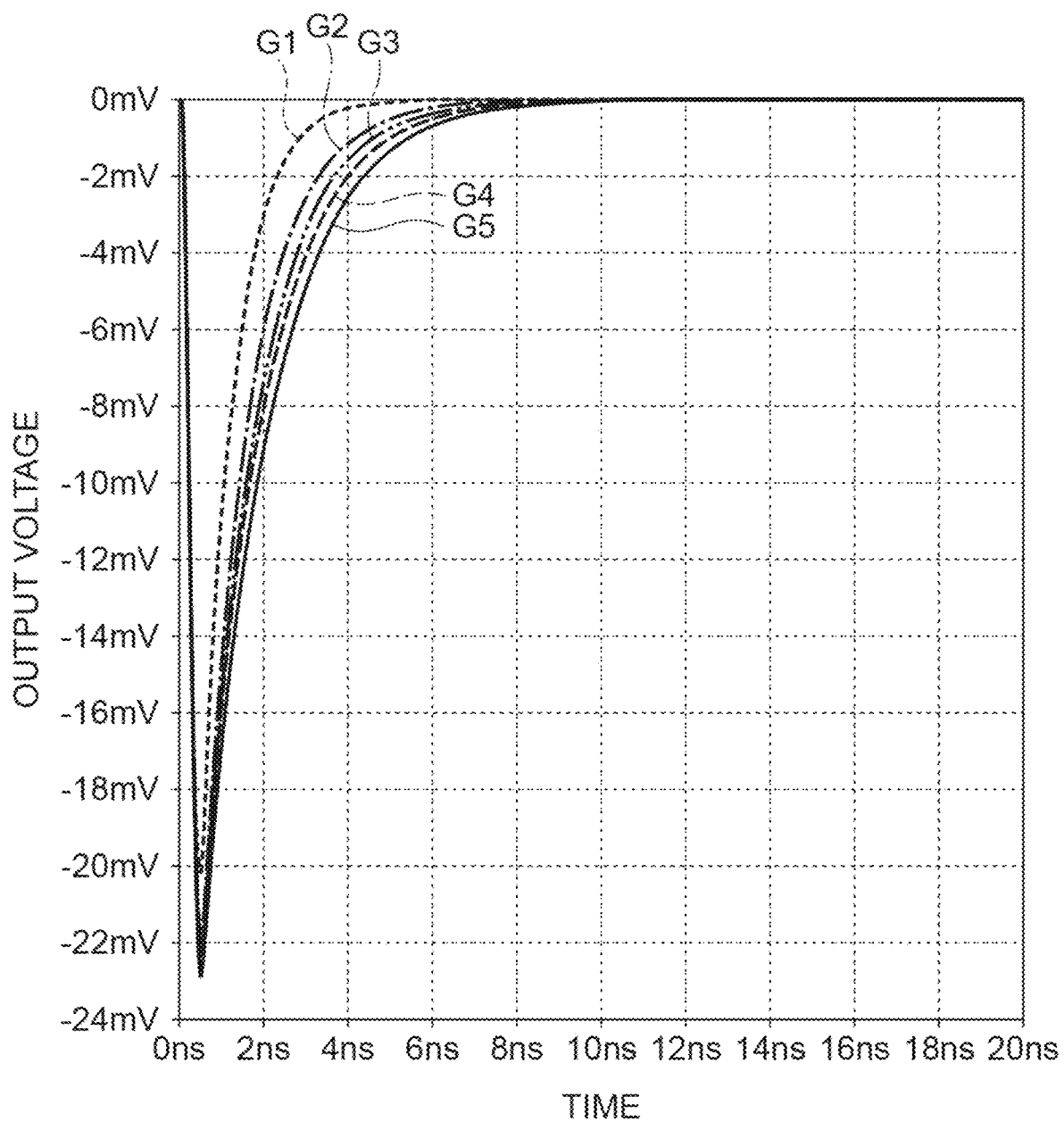
FIG. 9 is a view showing an example of a result of simulating a response waveform of the AD having an effective diameter of the electron incidence plane of 3 mm.

FIGS. 8 and 9 are views showing examples of a result of simulating the response waveform of the AD 220 when the resistance value of the resistor R1 is set to 100 kΩ and the capacitance C1 of the capacitor C1 is set to various values. FIG. 8 shows the result regarding the AD 220 ($C_{AD}$=5.8 pF) with an effective diameter of the electron incidence plane of 1 mm, and FIG. 9 shows the result regarding the AD 220 ($C_{AD}$=24 pF) with an effective diameter of the electron incidence plane of 3 mm FIGS. 8 and 9 also show the response waveform when the capacitor C1 and the resistor R1 are not provided. A graph G1 in the figures indicates a case of $C_1$=$C_{AD}$, a graph G2 indicates a case of $C_1$=$2C_{AD}$, a graph G3 indicates a case of $C_1$=$5C_{AD}$, a graph G4 indicates a case of $C_1$=$10C_{AD}$, and a graph G5 indicates a case without the capacitor C1 and the resistor R1.

In the AD 220 (FIG. 8) in which the effective diameter of the electron incidence plane is 1 mm, the half-value width (full width at half maximum FWHM) of the response waveform is 420 ps (picoseconds) in the case of $C_1$=$C_{AD}$ (graph G1), 460 ps in the case of $C_1$=$2C_{AD}$ (graph G2), 480 ps in the case of $C_1$=$5C_{AD}$ (graph G3), 490 ps in the case of $C_1$=$10C_{AD}$ (graph G4), and 510 ps in the case without the capacitor C1 and the resistor R1 (graph G5).

In the AD 220 (FIG. 9) in which the effective diameter of the electron incidence plane is 3 mm, the half-value width of the response waveform is 840 ps in the case of $C_1$=$C_{AD}$ (graph G1), 1130 ps in the case of $C_1$=$2C_{AD}$ (graph G2), 1220 ps in the case of $C_1$=$5C_{AD}$ (graph G3), 1300 ps in the case of $C_1$=$10C_{AD}$ (graph G4), and 1400 ps case without the capacitor C1 and the resistor R1 (graph G5).

The response waveforms shown in FIGS. 8 and 9 indicate that the response is sped up at least when the capacitance C1 of the capacitor C1 is 10 times or less the capacitance $C_{AD}$ of the AD.

FIGS. 10 to 13 are views showing examples of result of simulating a time change in the potential difference between the electrodes of the AD 220 and the response waveform of the AD 220 when the capacitance $C_1$ of the capacitor C1 is set to 2 pF and a resistance value $R_1$ of the resistor R1 is set to various values under the condition that an induced current with a wave height of 10 mV occurs at a frequency of 10 MHz.

Figure 10:
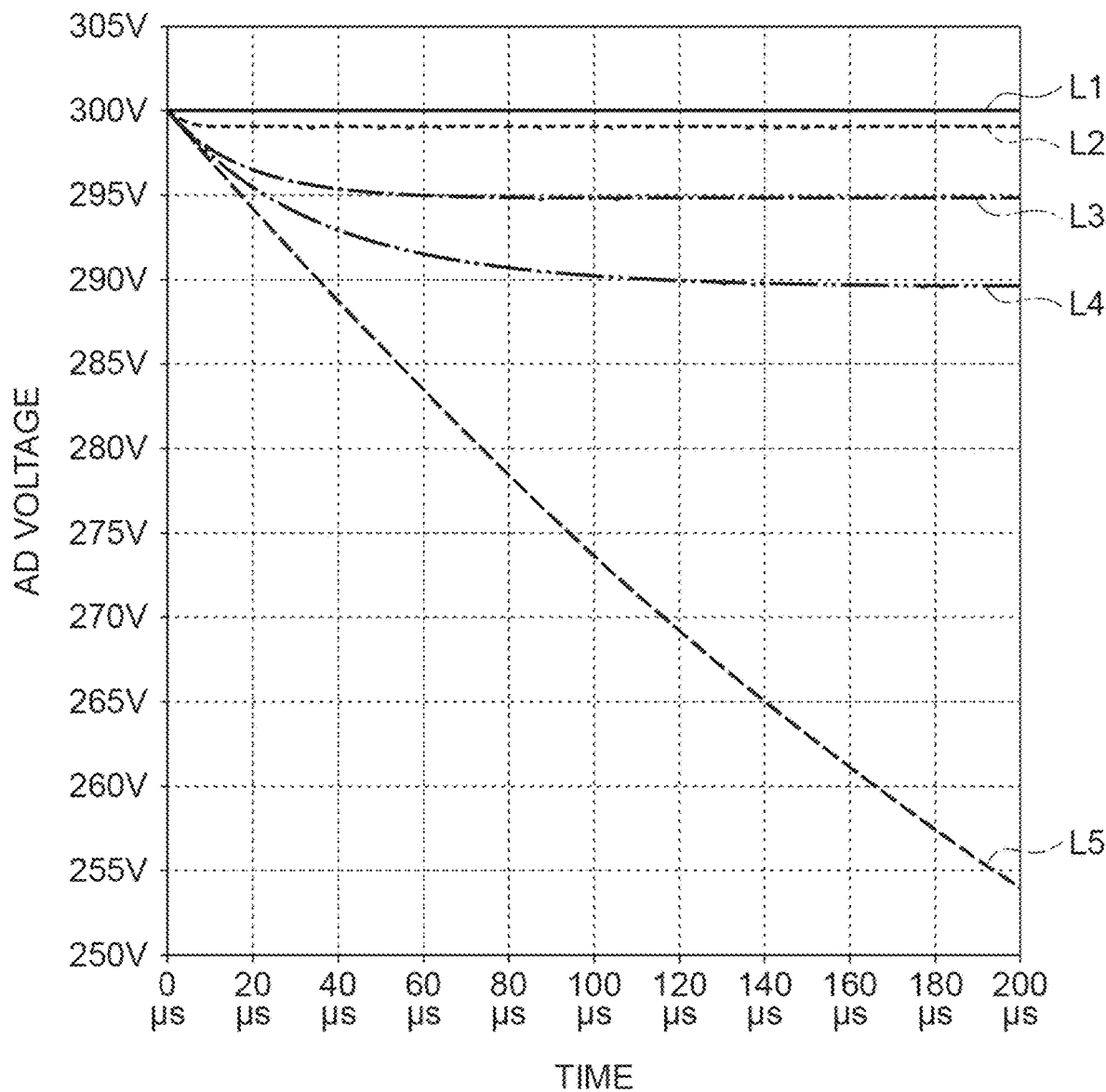
FIG. 10 is a view showing an example of a result of simulating a time change in a potential difference between electrodes of the AD having an effective diameter of the electron incidence plane of 3 mm.
Figure 11:
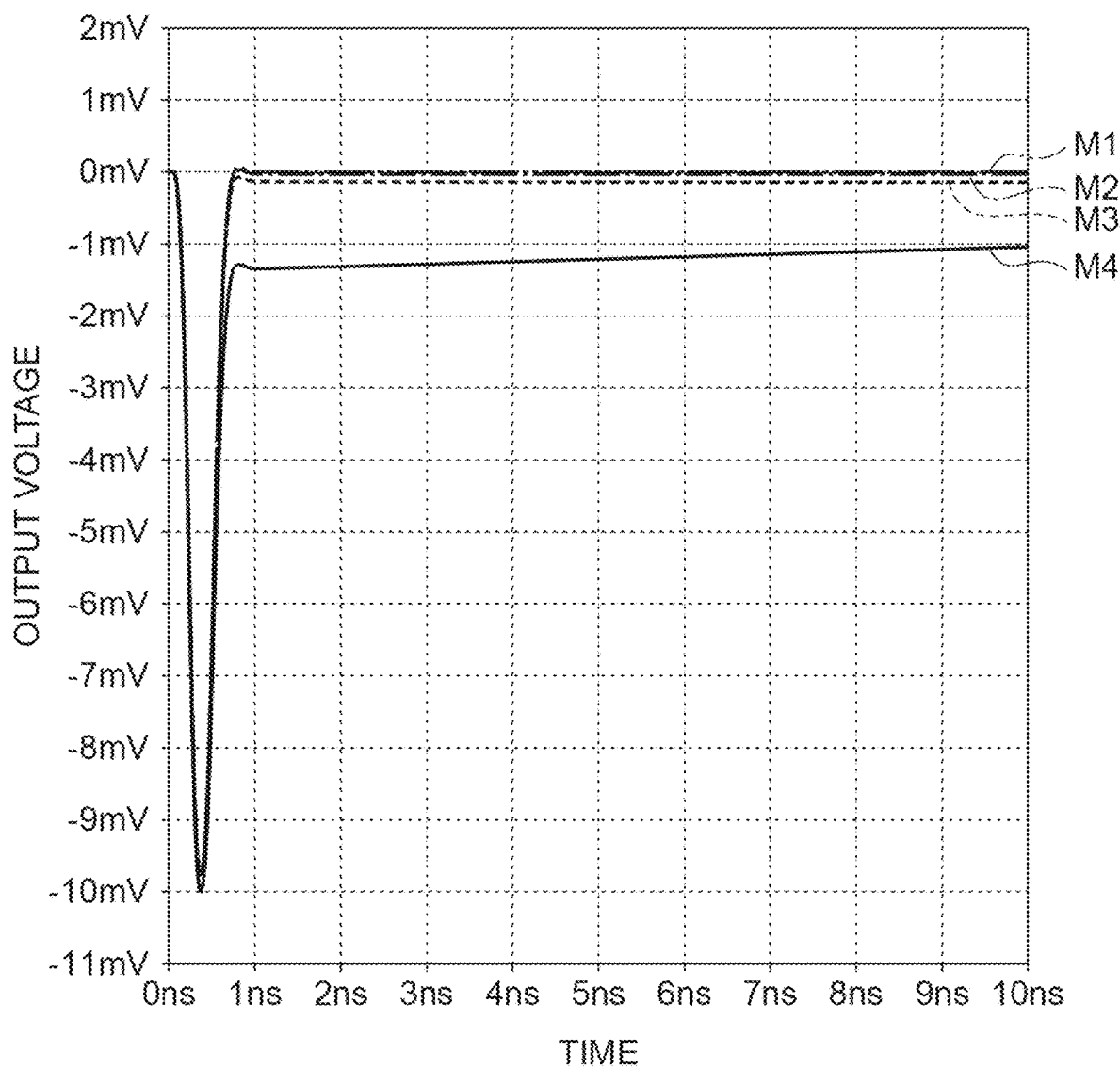
FIG. 11 is a view showing an example of a result of simulating a response waveform of the AD having an effective diameter of the electron incidence plane of 3 mm.
Figure 12:
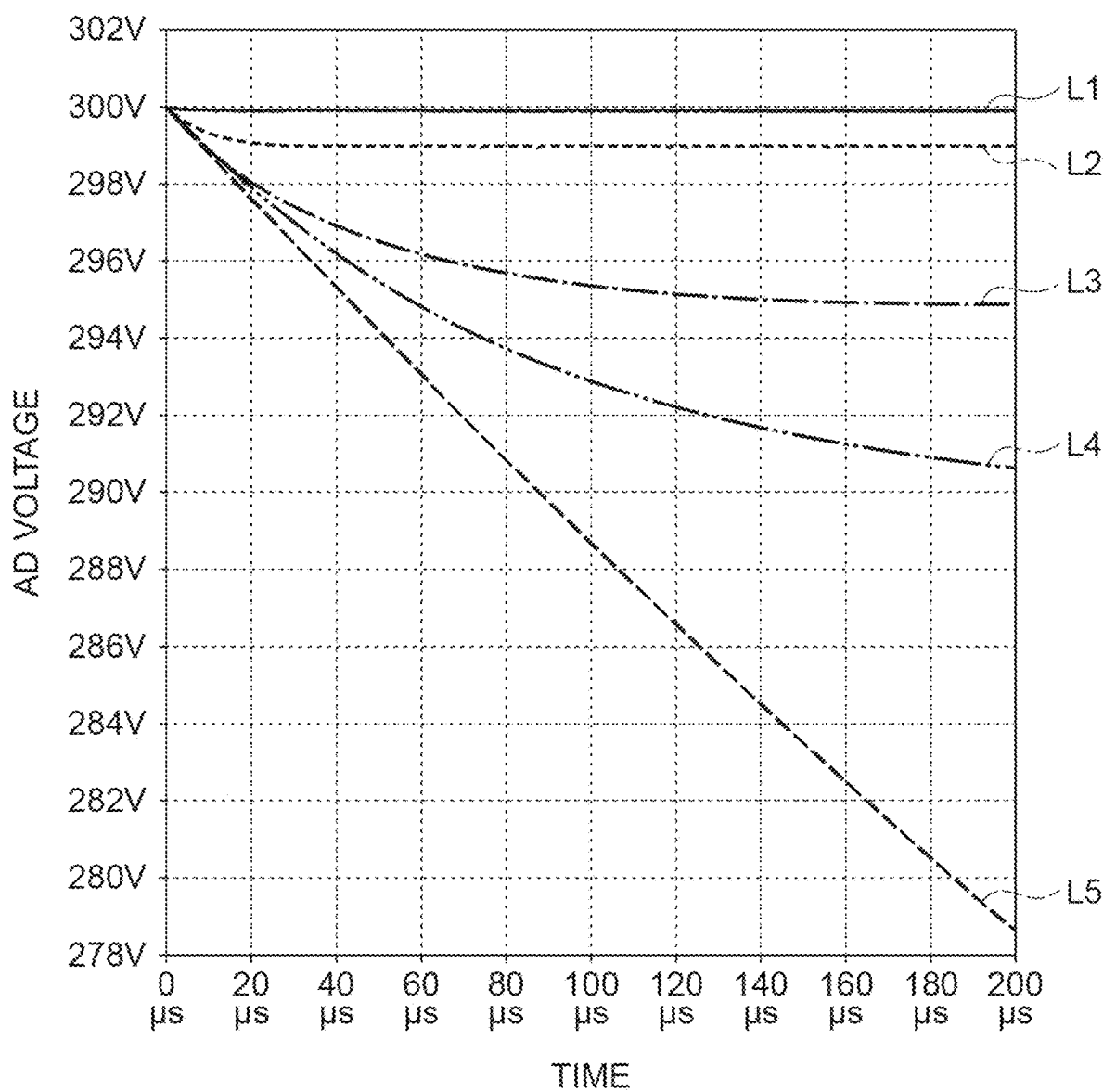
FIG. 12 is a view showing an example of a result of simulating a time change in a potential difference between electrodes of the AD having an effective diameter of the electron incidence plane of 5 mm.

FIG. 10 shows the result regarding the time change in the potential difference between the electrodes of the AD 220 ($C_{AD}$=24 pF) having an effective diameter of the electron incidence plane of 3 mm, and FIG. 11 shows the result regarding the response waveform of the same AD 220. FIG. 12 shows the result regarding the time change in the potential difference between the electrodes of the AD 220 ($C_{AD}$=85 pF) having an effective diameter of the electron incidence plane of 5 mm, and FIG. 13 shows the result regarding the response waveform of the same AD 220.

A graph L1 in FIGS. 10 and 12 indicates a case of $R_1=10$ kΩ, a graph L2 indicates a case of $R_1=100$ kΩ, a graph L3 indicates a case of $R_1=500$ kΩ, a graph L4 indicates a case of $R_1=1$ MΩ, and a graph L5 indicates a case of $R_1=10$ MΩ.

Figure 13:
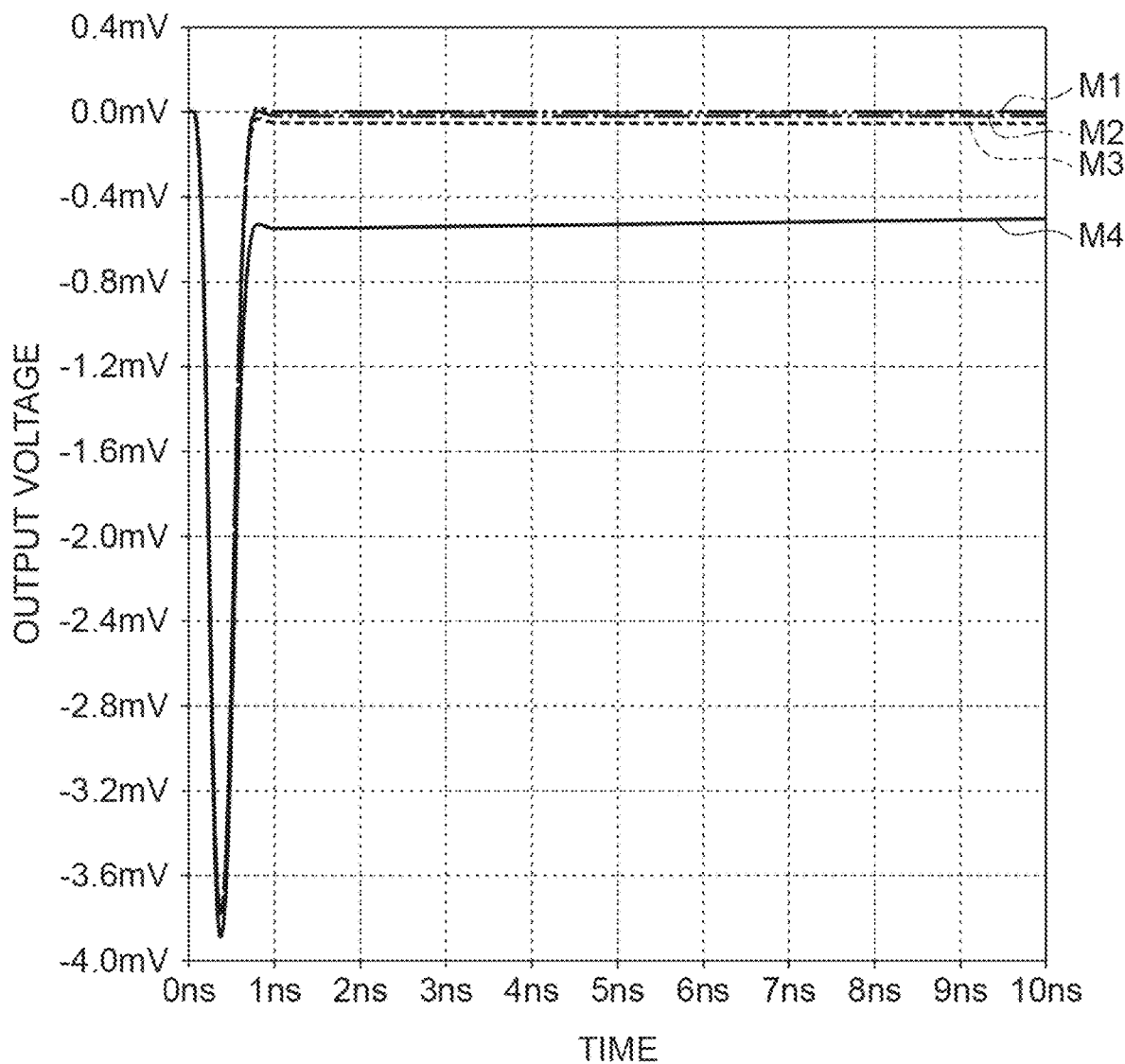
FIG. 13 is a view showing an example of a result of simulating a response waveform of the AD having an effective diameter of the electron incidence plane of 5 mm.

A graph M1 in FIGS. 11 and 13 indicates a case of $R_1=100$ kΩ, a graph M2 indicates a case of $R_1=30$ kΩ, a graph M3 indicates a case of $R_1=10$ kΩ, and a graph M4 indicates a case of $R_1=1$ kΩ.

An actual measurement has indicated that fluctuation in the potential difference between the electrodes of the AD 220 needs to be suppressed to 5 V or less in order to suppress fluctuation of the AD gain to 10% or less. The time change in the potential difference between the electrodes of the AD 220 shown in FIGS. 10 and 12 indicates that when the resistance value of the resistor $R_1$ is set to 500 kΩ or less, a decrease in the potential difference between the electrodes of the AD 220 from the initial value (300 V) is suppressed to 5 V or less. Therefore, in order to suppress fluctuation in the potential difference between the electrodes of the AD 220, the resistance value of the resistor R1 is, for example, 500 kΩ or less. In addition, the response waveforms of the AD 220 shown in FIGS. 11 and 13 indicate that the symmetry of the response waveform is maintained when the resistance value of the resistor R1 is 30 kΩ or more. Therefore, in order to maintain the symmetry of the response waveform, the resistance value of the resistor R1 is, for example, 30 kΩ or more.

In the AD drive circuit of the ion detector 1A according to the first embodiment, the capacitor C1 and the resistor $R_1$ are connected to the P-side of the AD 220. However, the capacitor C1 and the resistor $R_1$ may be connected to the N-side of the AD 220.

First Modification

Figure 14:
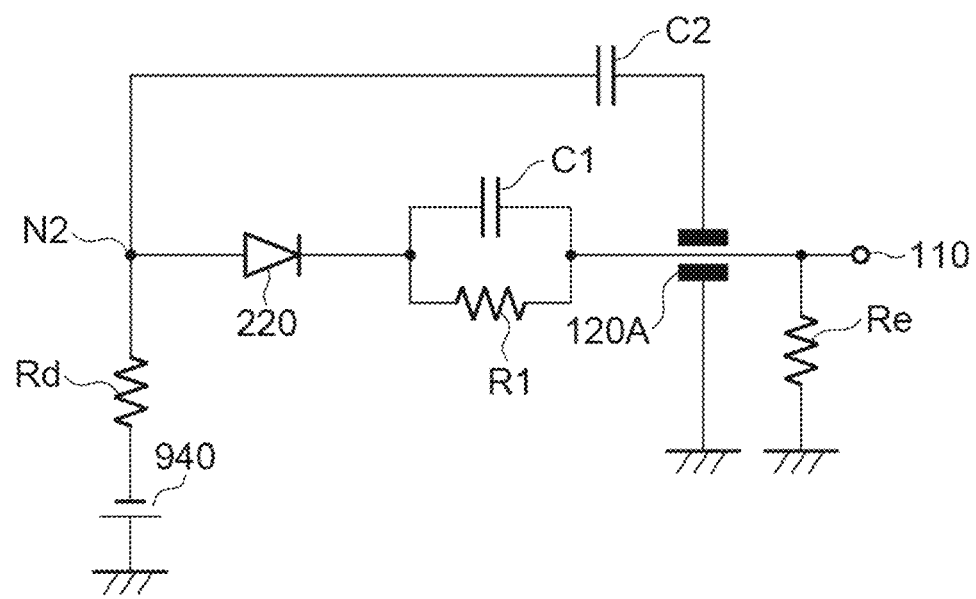
FIG. 14 is a circuit diagram showing an example of an AD drive circuit of an ion detector according to a first modification of the first embodiment.

FIG. 14 is a circuit diagram showing an example of an AD drive circuit of an ion detector according to a first modification of the first embodiment. The AD drive circuit of the ion detector according to the first modification is different from the AD drive circuit of the ion detector according to the first embodiment in that the AD drive circuit of the ion detector according to the first modification has a second circuit structure in which the capacitor C1, which is the first capacitor, and the resistor R1, which is the first resistor, are connected to an N-side electrode of the AD 220. Note that also in FIG. 14, the circuit symbol of the AD 220 is indicated by a general diode circuit symbol. Also in the AD drive circuit of the ion detector according to the first modification, the first capacitor C1 and the first resistor R1 are both connected in series to the AD 220, and connected in parallel to each other.

Specifically, the capacitor C1 is disposed on the wiring between the N-side electrode of the AD 220 and the node $N_F$ set to have the ground potential (second reference potential), and includes a first terminal electrically connected to the N-side electrode of the AD 220 and a second terminal electrically connected to the signal output terminal 110 branched from the wiring. The resistor R1 has a first terminal electrically connected to the N-side electrode of the AD 220 and a second terminal electrically connected to the signal output terminal 110. The first terminal of the capacitor C1 and the first terminal of the resistor R1 are set to have the same potential, and the second terminal of the capacitor C1 and the second terminal of the resistor R1 are set to have the same potential. One power supply terminal of the power supply 940 electrically connected to the node N2 is set to have the first reference potential, and the other power supply terminal is set to have the ground potential (second reference potential).

In the above configuration, the capacitance of the AD 220 connected to the AD drive circuit is apparently smaller than the capacitance of the AD 220 connected to the AD drive circuit of the comparative example shown in FIG. 5. Therefore, it is possible to speed up the response of the entire ion detector including the AD 220 and the AD drive circuit.

Second Modification

Figure 15:
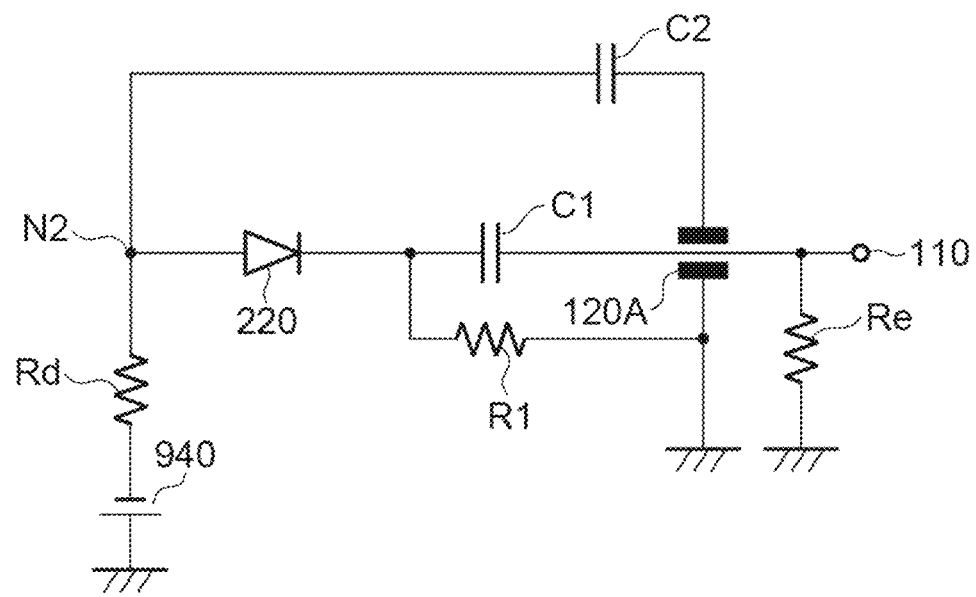
FIG. 15 is a circuit diagram showing an example of an AD drive circuit of an ion detector according to a second modification of the first embodiment.

FIG. 15 is a circuit diagram showing an example of an AD drive circuit of an ion detector according to a second modification of the first embodiment. Similarly to the AD drive circuit of the ion detector according to the first modification, the AD drive circuit of the ion detector according to the second modification has a second circuit structure in which the capacitor C1, which is the first capacitor, and the resistor R1, which is the first resistor, are connected to an N-side electrode of the AD 220. However, the AD drive circuit of the ion detector according to the second modification is different from the AD drive circuit of the ion detector according to the first modification in that the resistor R1 is directly grounded. Note that also in FIG. 15, the circuit symbol of the AD 220 is indicated by a general diode circuit symbol. Also in the AD drive circuit of the ion detector according to the second modification, both the capacitor C1 and the resistor R1 are connected in series to the AD 220, and are connected in parallel to each other through the termination resistor Re and the ground wiring (wiring provided with the node $N_F$).

Specifically, the capacitor C1 is disposed on the wiring between the N-side electrode of the AD 220 and the node $N_F$ set to have the ground potential (second reference potential), and includes a first terminal electrically connected to the N-side electrode of the AD 220 and a second terminal electrically connected to the signal output terminal 110 branched from the wiring. The resistor R1 has a first terminal electrically connected to the N-side electrode of the AD 220 and a second terminal set to have the ground potential (second reference potential). The first terminal of the capacitor C1 and the first terminal of the resistor R1 are set to have the same potential. On the other hand, the other terminal of the voltage drop element (the resistance Re in the example of FIG. 15) whose one terminal is electrically connected to the second terminal of the capacitor C1 and the second terminal of the resistor R1 are set to have the same potential. In the above configuration, it is possible to speed up the response of the entire ion detector including the AD 220 and the AD drive circuit. One power supply terminal of the power supply 940 electrically connected to the node N2 is set to have the first reference potential, and the other power supply terminal is set to have the ground potential (second reference potential).

Second Embodiment

Figure 16:
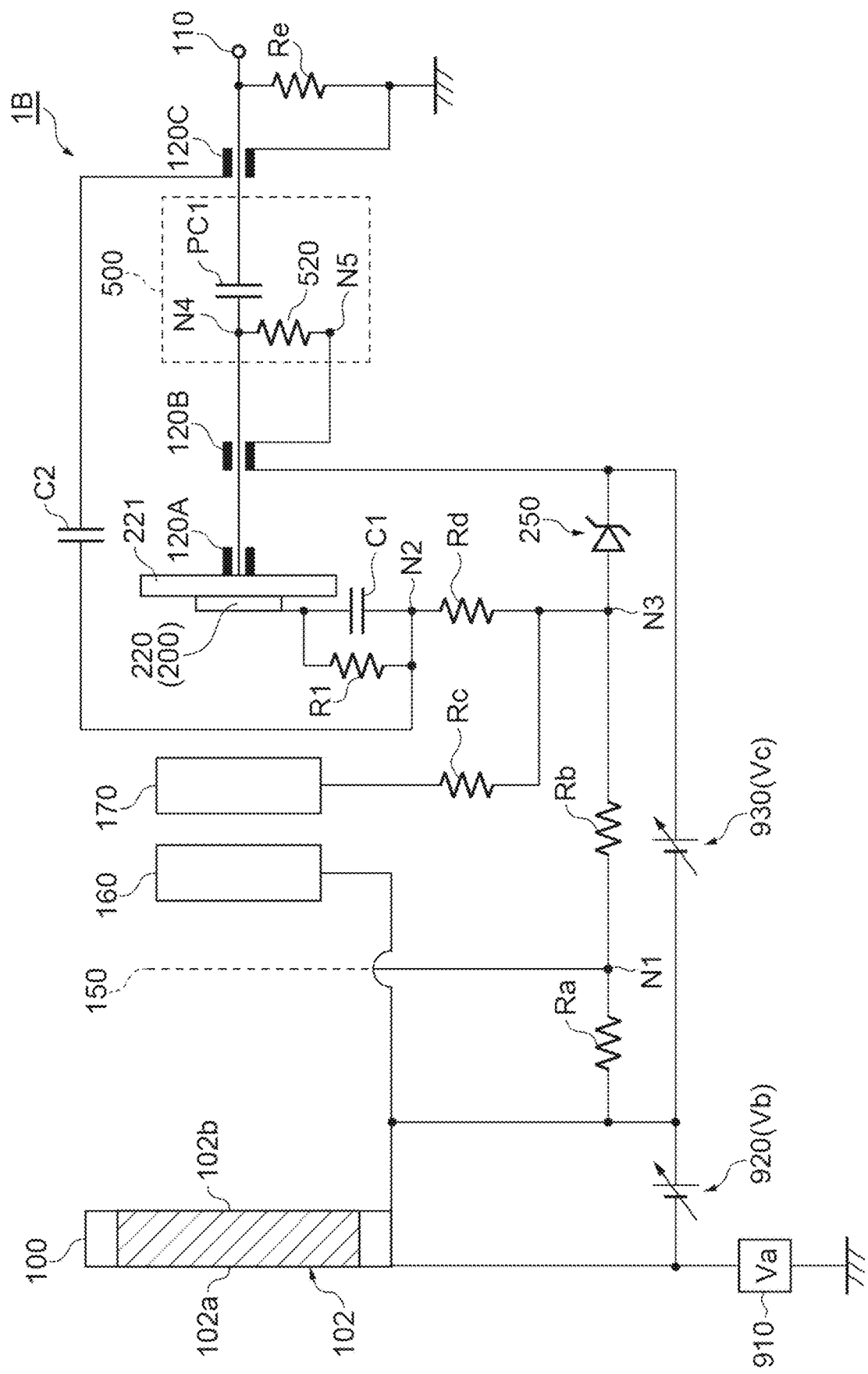
FIG. 16 is a circuit diagram showing an example of a circuit configuration of an ion detector according to a second embodiment.

FIG. 16 is a circuit diagram showing an example of the circuit configuration of an ion detector 1B according to the second embodiment of the detector of the present disclosure, and this drive circuit has the first circuit structure. The ion detector 1B according to the second embodiment is used for mass spectrometry in which bipolar ions can be a detection target. The ion detector 1B according to the second embodiment includes, between the AD 220 and the signal output terminal 110, an AC coupler (alternating-current coupling circuit including a capacitor or the like) 500 for extracting an alternating-current component as a signal.

That is, the ion detector 1B according to the second embodiment includes an MCP unit 100 as an electron multiplication unit, a mesh-like acceleration electrode 150, a pair of focus electrodes 160 and 170, an AD 220 as a signal output unit 200, an AC coupler 500, and a signal output terminal 110.

The MCP unit 100 includes an MCP 102 having an input plane 102a and an output plane 102b. Since the MCP 102 is similar to the MCP 102 of the ion detector 1A according to the first embodiment, a detailed description thereof will be omitted.

The acceleration electrode 150 is disposed between the MCP 102 and the AD 220, for example, between the MCP 102 and the focus electrode 160, and accelerates electrons emitted from the output plane 102b of the MCP 102.

The pair of focus electrodes 160 and 170 are disposed between the MCP 102 and the AD 220, for example, between the acceleration electrode 150 and the AD 220, and focuses the electrons accelerated by the acceleration electrode 150 toward the AD 220.

The AD 220 is mounted on the upper surface (the surface on the output plane 102b side) of the printed wiring board 221, and faces the output plane 102b of the MCP 102 across the acceleration electrode 150 and the pair of focus electrodes 160 and 170. An SMA jack 120A is attached to the lower surface (the surface on the signal output terminal 110 side) of the printed wiring board 221. The AD 220 captures the electrons focused by the pair of focus electrodes 160 and 170 and outputs the electrons as an electric signal.

An SMA plug 120B is attached to one side (AD 220 side) of the AC coupler 500. An SMA jack 120C is attached to the other side (signal output terminal 110 side) of the AC coupler 500.

The input plane 102a of the MCP unit 100 is connected to a power supply 910 and set to have a potential Va (e.g., +10 kV). A potential difference Vb (e.g., 0 V to 1 kV) is secured by the power supply 920 between the input plane 102a and the output plane 102b. A potential difference Vc (e.g., 0 V to 4 kV) is secured by a power supply 930 between the output plane 102b and the side surface of the SMA plug 120B. The potential difference Vc set between the output plane 102b and the SMA plug 120B is divided by a resistor Ra (e.g., 40 MΩ), a resistor Rb (e.g., 20 MΩ), and a Zener diode (hereinafter, referred to as "ZD") 250 that are connected in series with one another and in parallel with the power supply 930 between the output plane 102b and the side surface of the SMA plug 120B. The ZD 250 ensures a potential difference of, for example, 200 to 400 V between the resistor Rb and the side surface of the SMA plug 120B. The acceleration electrode 150 is connected to a node N1, which is located between the resistors Ra and Rb. Of the pair of focus electrodes, the focus electrode 160, located on the output plane 102b side, is set to have the same potential as that of the output plane 102b of the MCP. The focus electrode 170, located on the AD 220 side, is connected to a node N3 located between the resistor Rb and the ZD 250 via a resistor Rc (e.g., 1 kΩ).

The node N3, located between the resistor Rb and the ZD 250, is connected to the P-side electrode of the AD 220 via the resistor Rd (e.g., 1 kΩ), the capacitor C1, which is the first capacitor, and the resistor R1, which is the first resistor. The capacitor C1 and the resistor R1 are both connected in series to the P-side electrode of the AD 220 and the resistor Rd, and connected in parallel to each other.

The node N2, which is located between the capacitor C1 and the resistor R1 and the resistor Rd, are connected to the side surface of the SMA jack 120C via a capacitor C2 (e.g., 10 nF), which is the second capacitor, and the side surface of the SMA jack 120C is grounded. The signal output terminal 110 is also grounded via a termination resistor Re (e.g., 50Ω). Therefore, a return path is formed between the electron incidence plane of the AD 220 and the grounded side surface of the SMA jack 120C. When electron incidence onto the AD 220 continues, a voltage drop occurs on the electron incidence plane of the AD 220. In this case, the signal (output voltage) outputted from the AD 220 to the signal output terminal 110 reflects the fluctuation of the DC component due to this voltage drop. Therefore, by disposing the capacitor C2 between the electron incidence plane of the AD 220 and the side surface of the SMA jack 120C, the fluctuation of the DC component reflected in the output signal is canceled. In addition, the capacitor C2 enables the high-speed signal outputted from the AD 220 to the signal output terminal 110 to return to the AD 220 via the return path with low impedance.

The AC coupler 500 includes, as a third capacitor, a signal capacitor PC1 (e.g., 150 pF) for extracting an alternating-current component as a signal. The signal capacitor PC1 is connected between the N-side electrode of the AD 220 and the signal output terminal 110. A node N4, located between the N-side electrode of the AD 220 and the signal capacitor PC1, is connected to the side surface of the SMA plug 120B via a resistor 520 (e.g., 1 kΩ to 10 MΩ) in order to fix the potential of the N-side electrode of the AD 220.

Figure 17:
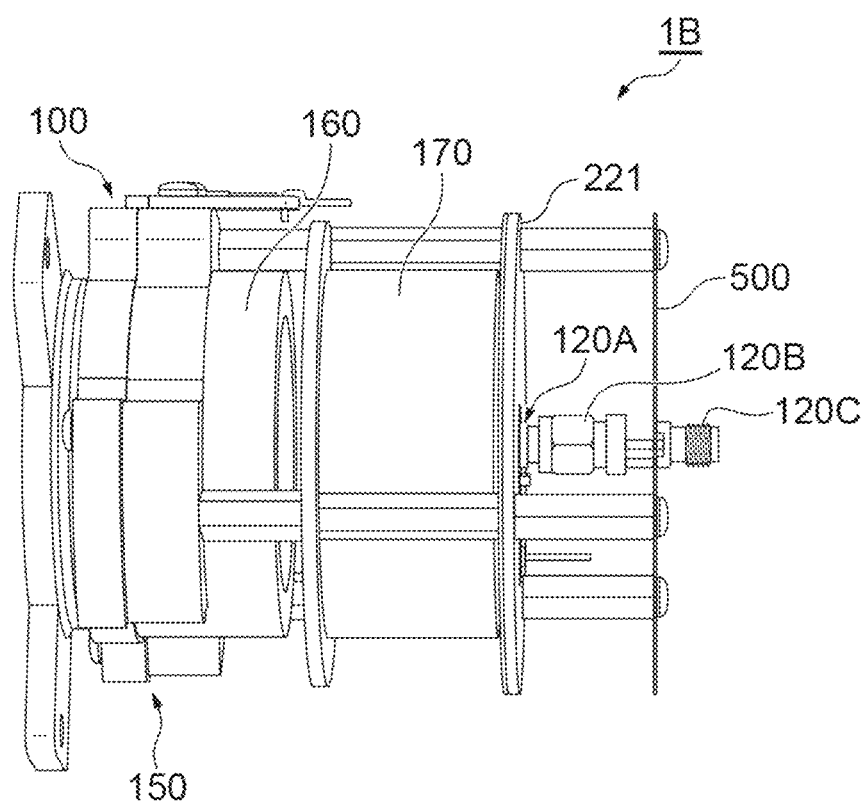
FIG. 17 is a view showing an example of an appearance of the ion detector according to the second embodiment.

FIG. 17 is a view showing an example of the appearance of the ion detector 1B according to the second embodiment. The MCP unit 100, the pair of focus electrodes 160 and 170, the printed wiring board 221 that constitutes a part of the signal output unit, and the AC coupler 500 are fixed via a spacer.

Figure 18:
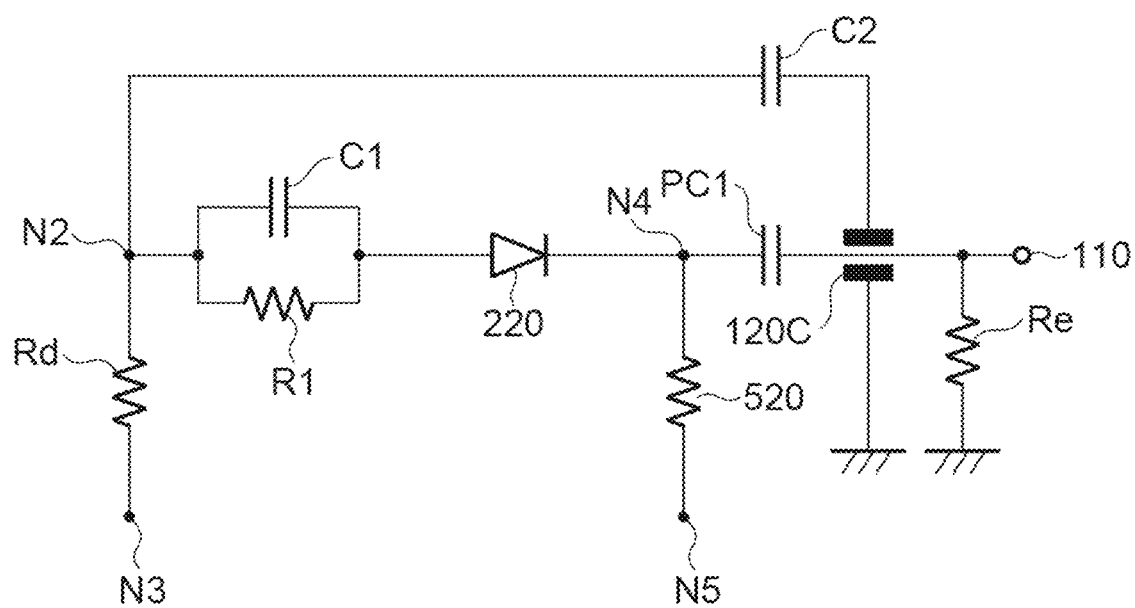
FIG. 18 is a circuit diagram showing an example of an AD drive circuit of the ion detector according to the second embodiment.

FIG. 18 is a circuit diagram showing an example of the AD drive circuit of the ion detector 1B according to the second embodiment, and this drive circuit has the first circuit structure. Note that also in FIG. 18, the circuit symbol of the AD 220 is indicated by a general diode circuit symbol. As described above, the P-side electrode of the AD 220 is connected to the node N3 (FIG. 16), which is located between the resistor Rb and the ZD 250, via the resistor Rd, the capacitor C1, which is the first capacitor, and the resistor R1, which is the first resistor, and the AD bias is applied. The capacitor C1 and the resistor R1 are both connected in series to the AD 220 and the resistor Rd, and connected in parallel to each other. The node N2, which is located between the capacitor C1 and the resistor R1 and the resistor Rd, are grounded via the capacitor C2, which is the second capacitor, and the side surface of the SMA jack 120C to form a return path. The N-side electrode of the AD 220 is connected to the signal output terminal 110 via the signal capacitor PC1, which is the third capacitor of the AC coupler 500. That is, the signal capacitor PC1 is disposed on the wiring between the N-side electrode of the AD 220 and the node $N_F$ set to have the ground potential (second reference potential), and has one terminal electrically connected to the N-side electrode of the AD 220, and the other terminal electrically connected to the signal output terminal 110. The N-side electrode of the AD 220 is connected to the power supply 930 (FIG. 16) via the resistor 520. The node N3 is electrically connected to the power supply terminal of the power supply 930 set to have the first reference potential, via the resistor Rd, the resistor Rb, and the resistor Ra.

The AD drive circuit of the ion detector 1B according to the second embodiment also has the capacitor C1 and the resistor R1. Since both the capacitor C1 and the resistor R1 are connected to the AD 220 in series and connected to each other in parallel, the apparent capacitance of the AD 220 connected to the AD drive circuit is small. Therefore, according to the ion detector 1B according to the second embodiment, it is possible to speed up the response of the entire ion detector including the AD 220 and the AD drive circuit.

While the ion detector has been shown as the first and second embodiments of the detector of the present disclosure, an embodiment of the detector of the present disclosure may be a photodetector.

Third Embodiment

Figure 19:
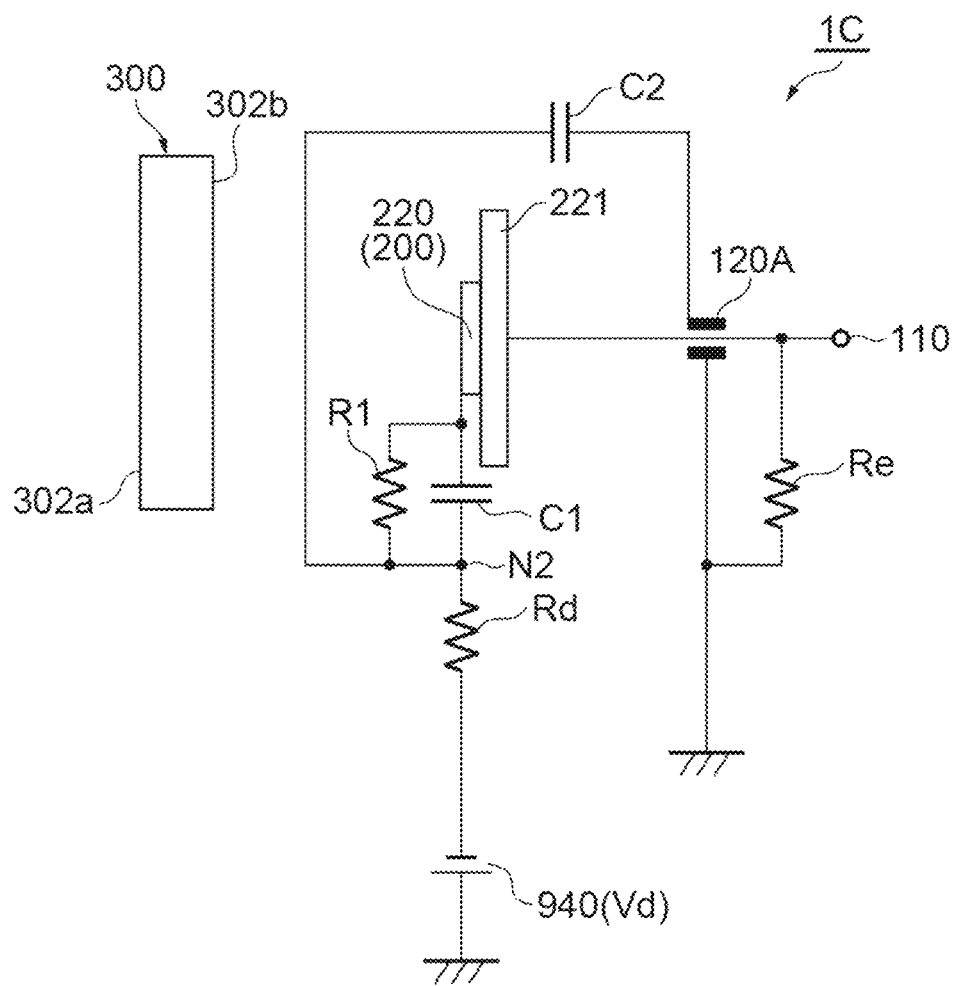
FIG. 19 is a circuit diagram showing an example of a circuit configuration of a photodetector according to a third embodiment.

FIG. 19 is a circuit diagram showing an example of the circuit configuration of a photodetector 1C according to the third embodiment of the detector of the present disclosure. The photodetector 1C according to the third embodiment includes a photoelectric conversion unit 300 in place of the MCP unit 100, the acceleration electrode 150, and the focus electrode 160 of the ion detector 1A according to the first embodiment, and a power supply and a resistor for setting a potential to them. The photoelectric conversion unit 300 has a light receiving surface 302a and an output plane 302b, and when light is incident to the light receiving surface 302a, generates photoelectrons in response to the light, and emits the photoelectrons from the output plane 302b. The AD 220 captures the photoelectrons and outputs the photoelectrons as an electric signal, and as a result, light is detected.

An AD drive circuit of the photodetector 1C according to the third embodiment also has a capacitor C1 and a resistor R1 that constitute the first circuit structure. Since both the capacitor C1 and the resistor R1 are connected to the AD 220 in series and connected to each other in parallel, the apparent capacitance of the AD connected to the AD drive circuit is small. The signal output terminal 110 is branched from the wiring between the N-side electrode of the AD 220 and the node $N_F$ set to have the ground potential (second reference potential). The capacitor C2 has one terminal electrically connected to the capacitor C1 and a terminal of the resistor R1 located on the power supply 940 side, and the other terminal set to have the same potential as that of the node $N_F$. Therefore, according to the photodetector 1C according to the third embodiment, it is possible to speed up the response of the entire ion detector including the AD 220 and the AD drive circuit.

The photodetector 1C according to the third embodiment includes a photoelectric conversion unit 300 in place of the MCP unit 100, the acceleration electrode 150, and the focus electrode 160 of the ion detector 1A according to the first embodiment, and a power supply and a resistor for setting a potential to them. However, the photodetector can be configured by adding the photoelectric conversion unit 300 to the ion detector 1A according to the first embodiment. That is, photoelectrons emitted from the output plane 302b of the photoelectric conversion unit 300 may be made incident on the input plane 102a of the MCP 102. When photoelectrons emitted from the output plane 302b of the photoelectric conversion unit 300 are incident on the input plane 102a, the MCP 102 multiplies the electrons in response to the photoelectrons and emits the multiplied electrons from the output plane 102b. The electrons emitted from the output plane 102b of the MCP 102 are accelerated by the acceleration electrode 150 and focused by the focus electrode 160. The AD 220 captures the electrons focused by the focus electrode 160 and outputs the electrons as an electric signal, thereby detecting light.

Similarly, the photodetector can also be configured by adding the photoelectric conversion unit 300 to the ion detector 1B according to the second embodiment.

The AD drive circuit of each of the photodetectors has the capacitor C1 and the resistor R1. Then, the capacitor C1 and the resistor R1 are both connected in series to the AD 220, and connected in parallel to each other. Therefore, it is possible to speed up the response of the entire photodetector including the AD 220 and the AD drive circuit.

As described above, according to the detector according to the present disclosure, it is possible to achieve speeding up of response in the detector that detects charged particles or light using the AD.

From the above description of the present disclosure, it is obvious that the present invention can be variously modified. Such modifications cannot be regarded as departing from the spirit and scope of the present invention, and improvements obvious to all those skilled in the art are included in the following claims.

What is claimed is:

1. A detector for detecting charged particles or light, the detector comprising:
    an avalanche diode having a first electrode electrically connected to a power supply terminal having a first reference potential different from a ground potential, a second electrode electrically connected to a signal output terminal, and an electron incidence plane on which electrons generated due to the charged particles, photoelectrons generated due to the light, or electrons generated by multiplication of the photoelectrons are incident; and
    a drive circuit configured to drive the avalanche diode, wherein
    the drive circuit includes:
    a first capacitor disposed on wiring between the power supply terminal and the first electrode of the avalanche diode, the first capacitor having a first terminal electrically connected to the power supply terminal, and a second terminal which is different from the first terminal of the first capacitor and electrically connected to the first electrode of the avalanche diode; and
    a first resistor connected in parallel with the first capacitor, the first resistor having a first terminal which is electrically connected to the first terminal of the first capacitor and has a same potential as a potential of the first terminal of the first capacitor, and a second terminal which is electrically connected to the second terminal of the first capacitor and has a same potential as a potential of the second terminal of the first capacitor.

2. The detector according to claim 1, wherein
    a capacitance of the first capacitor is ten times or less a capacitance of the avalanche diode.

3. The detector according to claim 2, wherein
    a capacitance of the first capacitor is equal to or less than a capacitance of the avalanche diode.

4. The detector according to claim 1, wherein
    a resistance value of the first resistor is 30 kδ or more and 500 kΩ or less.

5. The detector according to claim 1, wherein
    the signal output terminal is electrically connected to wiring between the second electrode of the avalanche diode and a node having a second reference potential different from the first reference potential, and the drive circuit further includes a second capacitor having a first terminal electrically connected to both the first terminal of the first capacitor and the first terminal of the first resistor, and a second terminal having a same potential as a potential of the node.

6. The detector according to claim 1, wherein
the drive circuit further includes a third capacitor as an AC coupler disposed on wiring between the signal output terminal and the second electrode of the avalanche diode, and the third capacitor has a first terminal electrically connected to the second electrode of the avalanche diode and a second terminal electrically connected to the signal output terminal.

7. The detector according to claim 1 further comprising:
a microchannel plate having an input plane on which the charged particles are incident and an output plane from which the electrons generated due to the charged particles are emitted; and
a focus electrode, wherein
the electrons emitted from the output plane of the microchannel plate are focused by the focus electrode, and then incident on the electron incidence plane of the avalanche diode.

8. The detector according to claim 1 further comprising:
a photoelectric conversion unit configured to convert the light into the photoelectrons, wherein
the photoelectrons or the electrons generated by multiplication of the photoelectrons are incident on the electron incidence plane of the avalanche diode.

9. A detector for detecting charged particles or light, the detector comprising:
an avalanche diode having a first electrode electrically connected to a power supply terminal having a first reference potential different from a ground potential, a second electrode electrically connected to a signal output terminal, and an electron incidence plane on which electrons generated due to the charged particles, photoelectrons generated due to the light, or electrons generated by multiplication of the photoelectrons are incident; and
a drive circuit configured to drive the avalanche diode, wherein
the drive circuit includes:
a first capacitor disposed on wiring located between the second electrode of the avalanche diode and a node having a second reference potential different from the first reference potential, the wiring electrically connected to the signal output terminal, the first capacitor having a first terminal electrically connected to the second electrode of the avalanche diode, and a second terminal while which is different from the first terminal of the first capacitor and electrically connected to the signal output terminal;
a second capacitor having a first terminal electrically connected to the first electrode of the avalanche diode, and a second terminal which is different from the first terminal of the second capacitor and has a same potential as a potential of the node; and
a first resistor connected in parallel with the first capacitor, the first resistor having a first terminal which is electrically connected to the first terminal of the first capacitor and has a same potential as a potential of the first terminal of the first capacitor, and a second terminal which is different from the first terminal of the first resistor, and
the second terminal of the first resistor is electrically connected to the second terminal of the first capacitor so as to have a same potential as a potential of the second terminal of the first capacitor, or the second terminal of the first resistor is electrically connected to the second terminal of the second capacitor so as to have a same potential as a potential of the second terminal of the second capacitor.

10. The detector according to claim 9, wherein
a capacitance of the first capacitor is ten times or less a capacitance of the avalanche diode.

11. The detector according to claim 9, wherein
a capacitance of the first capacitor is equal to or less than a capacitance of the avalanche diode.

12. The detector according to claim 9, wherein
a resistance value of the first resistor is 30 kΩ or more and 500 kΩ or less.

13. The detector according to claim 9 further comprising:
a microchannel plate having an input plane on which the charged particles are incident and an output plane from which the electrons generated due to the charged particles are emitted; and
a focus electrode, wherein
the electrons emitted from the output plane of the microchannel plate are focused by the focus electrode, and then incident on the electron incidence plane of the avalanche diode.

14. The detector according to claim 9 further comprising:
a photoelectric conversion unit configured to convert the light into the photoelectrons, wherein
the photoelectrons or the electrons generated by multiplication of the photoelectrons are incident on the electron incidence plane of the avalanche diode.

* * * * *